United States Patent
Sours et al.

(10) Patent No.: US 12,223,437 B1
(45) Date of Patent: Feb. 11, 2025

(54) SYSTEMS AND METHODS FOR BATTERY PERFORMANCE PREDICTION

(71) Applicant: SB Technology, Inc., Tarrytown, NY (US)

(72) Inventors: Tyler Sours, Fort Collins, CO (US); Shivang Agarwal, Los Angeles, CA (US); Steffen Ridderbusch, London (GB); Jordan E. Crivelli-Decker, El Cerrito, CA (US); Yunyun Sarah Wang, Arlington, VA (US); Ang Xiao, Woodbury, MN (US)

(73) Assignee: SB Technology, Inc., Tarrytown, NY (US)

( * ) Notice: Subject to any disclaimer, the term of this patent is extended or adjusted under 35 U.S.C. 154(b) by 0 days.

(21) Appl. No.: 18/639,903

(22) Filed: Apr. 18, 2024

(51) Int. Cl.
*G06N 5/022* (2023.01)
*G01R 31/367* (2019.01)
(Continued)

(52) U.S. Cl.
CPC .......... *G06N 5/022* (2013.01); *G01R 31/367* (2019.01); *G01R 31/392* (2019.01); *G01R 31/396* (2019.01)

(58) Field of Classification Search
CPC .... G06N 5/022; G01R 31/367; G01R 31/392; G01R 31/396
See application file for complete search history.

(56) References Cited

U.S. PATENT DOCUMENTS

| | | |
|---|---|---|
| 11,226,374 B2 | 1/2022 | Severson et al. |
| 11,293,987 B2 | 4/2022 | Lee et al. |

(Continued)

FOREIGN PATENT DOCUMENTS

| | | | | |
|---|---|---|---|---|
| CN | 110443377 | 11/2019 | | |
| CN | 113740752 A | * 12/2021 | ......... | G01R 31/3648 |

(Continued)

OTHER PUBLICATIONS

Greenbank et al., "Automated feature extraction and selection for data-driven models of rapid battery capacity fade and end of life," IEEE Transactions on Industrial Informatics, Aug. 20, 2021, 18(5):2965-2973.

(Continued)

*Primary Examiner* — John C Kuan
(74) *Attorney, Agent, or Firm* — Fish & Richardson P.C.

(57) ABSTRACT

Methods, systems, and apparatus, including computer programs encoded on computer storage media, for battery performance prediction. One of the methods includes actions of receiving battery test data of a battery cell. The battery test data includes data of at least one battery cell property of at least two battery tests. Each battery test includes applying pulses on the battery cell during a battery cycle. The battery test data is provided as input to a machine learning system to predict battery cell performance. The machine learning system includes a machine learning model that has been trained using training data includes test data of battery cells that reached respective end of life (EOL) cycles. In response, a prediction result for the battery cell is automatically generated by the machine learning model. The prediction result indicates an EOL cycle of the battery cell. An action is taken based on the prediction result.

20 Claims, 12 Drawing Sheets

(51) Int. Cl.
  *G01R 31/392* (2019.01)
  *G01R 31/396* (2019.01)

(56) References Cited

U.S. PATENT DOCUMENTS

| | | | |
|---|---|---|---|
| 11,300,623 | B2 | 4/2022 | Badwekar et al. |
| 11,573,271 | B1 * | 2/2023 | Eifert ................. G01R 31/3646 |
| 2019/0113577 | A1 * | 4/2019 | Severson ........... G01R 31/3842 |
| 2022/0074993 | A1 | 3/2022 | Aykol et al. |
| 2022/0137149 | A1 | 5/2022 | Chueh et al. |
| 2023/0029405 | A1 * | 1/2023 | Stefanopoulou .... H01M 4/1391 |

FOREIGN PATENT DOCUMENTS

| | | |
|---|---|---|
| CN | 115656834 | 1/2023 |
| CN | 115856646 | 3/2023 |
| CN | 116774057 | 9/2023 |
| GB | 2583510 | 11/2020 |
| KR | 100903489 | 6/2009 |
| KR | 20140129844 A * | 11/2014 |
| KR | 20240027444 | 3/2024 |
| TW | I794787 | 3/2023 |
| WO | WO2022035151 | 2/2022 |
| WO | WO-2022144542 A1 * | 7/2022 |

OTHER PUBLICATIONS

Richardson et al., "Gaussian process regression for in situ capacity estimation of lithium-ion batteries," CoRR, Submitted on Dec. 18, 2017, arXiv: 1712.02595v2, 13 pages.

Severson et al., "Data-driven prediction of battery cycle life before capacity degradation," Nature Energy, May 2019, 4:383-391.

Zhang et al., "A machine learning-based framework for online prediction of battery ageing trajectory and lifetime using histogram data," Journal of Power Sources, Apr. 1, 2022, 526(231110):1-13.

* cited by examiner

| EXAMPLE | FEATURES | MODEL | RMSE | STD |
|---|---|---|---|---|
| Example 1 | mean, min, max, skew, kurtosis, variance of 10x DCIR pulse $\Delta Q(V)$ (cycles 102 - 2) | Nu Support Vector Regression | 186 | 104 |
| Example 2 | mean, min, max, skew, kurtosis, variance of 10x DCIR pulse $\Delta Q(V)$ (cycles 102 - 2) | Regularized Regression (Elastic Net) | 208 | 128 |
| Example 3 | mean, min, max, skew, kurtosis, variance of 10x DCIR pulse $\Delta Q(V)$ (cycles 102 - 2) | Random Forest Regression | 122 | 112 |

FIG. 5

| Model Architecture | Features | RMSE |
| --- | --- | --- |
| Random Forest Regressor | $dQ(V)_{110-10}$ | 221 ± 253 |
| | DCIR pulses (cycle 2) | 131 ± 106 |
| | DCIR_$dQ(V)_{202-2}$ | 104 ± 115 |
| | $(p_1, p_2)_{199-29}$ | 191 ± 222 |
| | $dQ/dV_{90-10}$ | 275 ± 248 |
| | All features | 100 ± 96 |
| Elastic Net | $dQ(V)_{110-10}$ | 272 ± 246 |
| | DCIR pulses (cycle 2) | 337 ± 185 |
| | DCIR_$dQ(V)_{202-2}$ | 232 ± 182 |
| | $(p_1, p_2)_{199-29}$ | 314 ± 221 |
| | $dQ/dV_{90-10}$ | 285 ± 222 |
| | All features | 210 ± 142 |

FIG. 7

SYSTEMS AND METHODS FOR BATTERY PERFORMANCE PREDICTION

TECHNICAL FIELD

The present disclosure relates to battery performance assessment.

BACKGROUND

Batteries are widely used due to low and falling costs, high energy densities, and long cycle lives. However, predicting battery lifespan normally requires long-term data collection and knowledge of battery degradation mechanisms.

SUMMARY

The present disclosure describes technologies for battery performance prediction. These technologies generally involve methods of predicting battery performance using machine learning models, which enables accurate and simplified battery performance prediction by utilizing data from early cycles of a battery's operation to estimate end-of-life (EOL) cycle and/or identify catastrophic fade in the battery.

In general, one innovative aspect of the subject matter described in this present disclosure can be embodied in methods that include the actions of receiving battery test data of a battery cell. The battery test data includes data of at least one battery cell property derived from at least two battery tests. Each of the at least two battery tests includes applying one or more pulses on the battery cell during at least one portion of a corresponding/specified battery cycle. The battery test data of the battery cell is provided as input to a machine learning system running on a computing system to predict cell performance of the battery cell. The machine learning system includes a machine learning model that has been trained using training data including battery test data of battery cells that reached their respective end of life (EOL) cycles (i.e., that eventually reached their respective EOL cycles). In other words, the training data includes battery test data for a plurality of battery cells, and the training data for an individual cell includes battery test data for a battery cell when that battery cell reached its EOL cycle. The actions include automatically generating a prediction result for the battery cell by the machine learning model. The prediction result indicates an EOL cycle of the battery cell. An action is taken based on the prediction result for the battery cell.

Another aspect of the subject matter described in this present disclosure can be embodied in system that includes one or more computers and one or more storage devices on which are stored instructions that are operable, when executed by the one or more computers, to cause the one or more computers to perform operations for predicting battery cell performance. The operations include receiving battery test data of a battery cell. The battery test data includes data of at least one battery cell property of at least two battery tests. Each of the at least two battery tests includes applying one or more pulses on the battery cell during at least one portion of a corresponding battery cycle. The battery test data of the battery cell is provided as input to a machine learning system to predict cell performance of the battery cell. The machine learning system includes a machine learning model that has been trained using training data including battery test data of battery cells that reached respective end of life (EOL) cycles. The operations include automatically generating a prediction result for the battery cell by the machine learning model. The prediction result includes an EOL cycle of the battery cell. An action is taken based on the prediction result for the battery cell.

Another aspect of the subject matter described in this present disclosure can be embodied in methods that include the actions of, for each cycle of at least a first cycle and a second cycle of a battery cell, receiving data of a charge-voltage curve for the cycle. The receiving includes at least one of: (a) receiving battery test data from cycling the battery cell between a first voltage and a second voltage and applying one or more pulses to the battery cell during at least one portion of the cycle, and (b) receiving data describing one or more battery cell physical properties during the cycling. The actions include calculating, using the data from the charge-voltage curves for the first cycle and the second cycle, features describing a difference between the charge-voltage curves for the first cycle and for the second cycle. The features of the battery cell are provided as input to a machine learning system to predict cell performance of the battery cell. The machine learning system includes a machine learning model that has been trained using training data including battery test data of battery cells that reached their respective end of life (EOL) cycles. The actions include automatically generating a prediction result for the battery cell by the machine learning model. The prediction result indicates an EOL cycle of the battery cell. The actions also include taking an action based on the prediction result for the battery cell.

Other embodiments of these aspects include corresponding computer systems, apparatus, and computer programs recorded on one or more computer storage devices, each configured to perform the actions of the methods. A system of one or more computers to be configured to perform particular operations or actions means that the system has installed software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. In particular, one embodiment includes all the following features in combination.

In some implementations, the battery test data includes, for each of the one or more pulses, data based on a difference of the at least one battery cell property of the at least two battery tests.

In some implementations, the data based on the difference of the at least one battery cell property of the at least two battery tests includes: for each of the one or more pulses, one or more characteristics of data points associated with the pulse.

In some implementations, the one or more characteristics include at least one of skew, kurtosis, variance, mean, minimum, or maximum.

In some implementations, each of the one or more characteristics of each of the one or more pulses is used as a respective input feature of one or more input features of the input to the machine learning model. A number of the one or more input features of the input to the machine learning model is identical to or greater than a product of a number of the one or more characteristics and a number of the one or more pulses.

In some implementations, the difference of the at least one battery cell property includes at least one of a battery cell capacity change, a ratio between a battery cell capacity change and a battery cell voltage, a ratio between a battery cell capacitance change and a battery cell voltage change, a battery cell internal resistance change, a ratio between a battery cell internal resistance change and a battery cell voltage, or a ratio between a battery cell internal resistance change and a battery cell voltage change.

In some implementations, each of the at least two battery tests includes at least one of Direct Current Internal Resistance (DCIR) test, Hybrid Pulse Power Characterization (HPPC) test, or minimum pulse power characterization (MPPC) test.

In some implementations, the corresponding battery cycle is a single cycle having a charging portion and a discharging portion. The at least one portion of the corresponding battery cycle includes one of the charging portion and the discharging portion. The one or more pulses include a plurality of current pulses. The battery test includes applying each of the plurality of current pulses on the battery cell when a capacity of the battery cell is changed from a respective charge by the predetermined percentage of state of charge (SOC).

In some implementations, the at least one portion of the corresponding battery cycle includes the discharging portion having multiple periods associated with the predetermined percentage of SOC. Each of the plurality of current pulses is a current discharging pulse applied in a respective period of the multiple periods.

In some implementations, the at least two battery tests include a first battery test during a first battery cycle and a second battery test during a second battery cycle that is later than the first battery cycle in a lifetime of the battery cell.

In some implementations, the first battery cycle is within first 10 cycles of the lifetime of the battery cell.

In some implementations, the first battery cycle is 2nd cycle of the lifetime of the battery cell.

In some implementations, an interval between the first battery cycle and the second battery cycle is about 100 cycles.

In some implementations, the first battery cycle and the second battery cycle are within about first 100 cycles of the lifetime of the battery cell.

In some implementations, the machine learning model includes a regression algorithm. The regression algorithm includes at least one of Random Forest Regression, Regularized Regression, or Nu Support Vector Regression.

In some implementations, the machine learning model is a first machine learning model trained for a first type of battery cells. A second machine learning mode running on the computing system has been trained for a second type of battery cells. The first type of battery cells and the second type of battery cells can have different battery cell chemistry.

In some implementations, the machine learning model is trained for two or more types of battery cells that have different battery cell chemistry.

In some implementations, after training the machine learning model with the training data, the actions include evaluating the machine learning model with evaluation data that include battery test data of battery cells having a range of EOL cycles. The actions can also include adjusting, based on a result of evaluating the machine learning model, one or more parameters of the machine learning model to further train the machine learning model.

In some implementations, the actions include updating one or more parameters of the machine learning model based on the battery test data of the battery cell and the prediction result for the battery cell.

In some implementations, the machine learning model is a first machine learning model. The training data includes battery test data of first battery cells that experienced catastrophic fade and battery test data of second battery cells that have a normal lifetime without experiencing catastrophic fade. The machine learning system includes a second machine learning model that has been trained using the training data. The actions include providing the battery test data of the battery cell as input to the second machine learning model to predict whether the battery cell will experience catastrophic fade, and automatically generating a second prediction result for the battery cell by the second machine learning model. The second prediction result indicates one of: i) the battery cell being a defective battery cell that will experience catastrophic fade, and ii) the battery cell being a normal battery cell that will not experience catastrophic fade. The actions also include taking a second action based on the second prediction result for the battery cell.

In some implementations, the battery test data of the battery cell includes data of a plurality of values of a battery cell property corresponding to a plurality of pulses in a portion of a single cycle of one of the at least two battery tests. The actions include providing the data of the plurality of values of the battery cell property of the battery cell as input to a second machine learning model running on the computing system to predict whether the battery cell will experience catastrophic fade. The second machine learning model has been trained using training data includes battery test data of battery cells that experienced catastrophic fade. The actions include automatically generating a second prediction result for the battery cell by the second machine learning model. The second prediction result indicates one of: i) the battery cell being a defective battery cell that will experience catastrophic fade, and ii) the battery cell being a normal battery cell that will not experience catastrophic fade. The actions also include taking a second action based on the second prediction result for the battery cell.

In some implementations, the single cycle is within first 10 cycles of the lifetime of the battery cell.

In some implementations, the second machine learning model includes at least one of Multilayer Perceptron Classifier (MLP), support vector machines (SVM) with nonlinear kernels, Decision Trees, Random Forests, artificial neural network, or gradient boosting machine (GBM).

In some implementations, receiving the battery test data of the battery cell includes: receiving the battery test data of the battery cell from a remote computing device in communication with the computing system through a communication network. Taking the action based on the prediction result for the battery cell includes at least one of: transmitting the prediction result for the battery cell to the remote computing device through the communication network, or presenting the prediction result for the battery cell on a web portal of the computing system to be accessible by the remote computing device.

In the present disclosure, the term "end-of-life" ("EOL") can be defined as when the cell reaches a threshold percentage (e.g., below 85%, below 80%, or below 70%) of its previous maximum discharge capacity. The term "catastrophic fade" refers to a sudden drop in a battery cell's peak performance and occurs when a rate of loss in the battery cell's peak capacity suddenly increases. The catastrophic fade can be a nonlinear fade and can occur at any suitable percentage of the battery cell's peak capacity. In some examples, a catastrophic fade in a battery cell, e.g., in a lithium-ion battery cell, can be defined numerically as a loss of over 20% of its total capacity within less than 1% of its expected lifecycle in terms of charge-discharge cycles. Alternatively, a catastrophic fade in a battery cell, e.g., in a lithium-ion battery cell, can be defined numerically as a loss of over 30% of its total capacity within less than 5% of its expected lifecycle in terms of charge-discharge cycle or as a loss of over 25% of its total capacity within less than 5% of its expected lifecycle in terms of charge-discharge cycles, or as a loss of over 25% of its total capacity within less than 25% of its expected lifecycle in terms of charge-discharge cycles.

The subject matter described in the present disclosure can be implemented in particular embodiments so as to realize one or more of the following advantages. For example, the technologies disclosed herein enable a prediction of battery EOL with a lower root mean square error (RMSE), e.g., RMSE of about 100 cycles, using early-cycle battery test data. In addition, or alternatively, the implementation of this disclosure enables diagnosis of catastrophic fade of battery cells much before their lifetime expectancy, e.g., within first 10 cycles. End user's prior knowledge of the underlying battery chemistry is not required for both predictions, making the prediction methods more universally applicable and user-friendly. In some implementations, at least one machine learning (ML) model is utilized with early-cycle battery test data, e.g., Direct Current Internal Resistance (DCIR) test, to provide high accuracy in predicting battery EOL cycle and/or the catastrophic fade of a battery cell. In some implementations, the technologies require data of just two charge-discharge cycles from end users for EOL prediction, which is cost-effective and time efficient. Moreover, using data from an early cycle of the battery's operation can predict battery performance at an early life stage, which reduces waste by preventing the use of batteries that may have a short EOL and/or catastrophic fade. Further, the technologies disclosed herein can be implemented as Software as a Service (SaaS) running in a cloud server, which can provide the service of battery performance prediction to end users worldwide through a network connection. The service can be applied to various types of battery cells for a broad application in industry, e.g., in electric vehicles and renewable energy storage systems. In addition, new battery test data from end users can be used to enhance accuracy of the ML model, allowing for personalized predictions tailored to individual user needs and making the model more robust.

The details of one or more embodiments of the subject matter of the present disclosure are set forth in the accompanying drawings and the description below. Other features, aspects, and advantages of the subject matter will become apparent from the description, the drawings, and the claims.

BRIEF DESCRIPTION OF THE DRA WINGS

FIG. 5 is a table showing example battery EOL cycle prediction results with different regression models.

FIG. 7 is a table showing metrics computed from a combination of different regression models and input features.

Like reference numbers and designations in the various drawings indicate like elements.

DETAILED DESCRIPTION

Figure 1A:
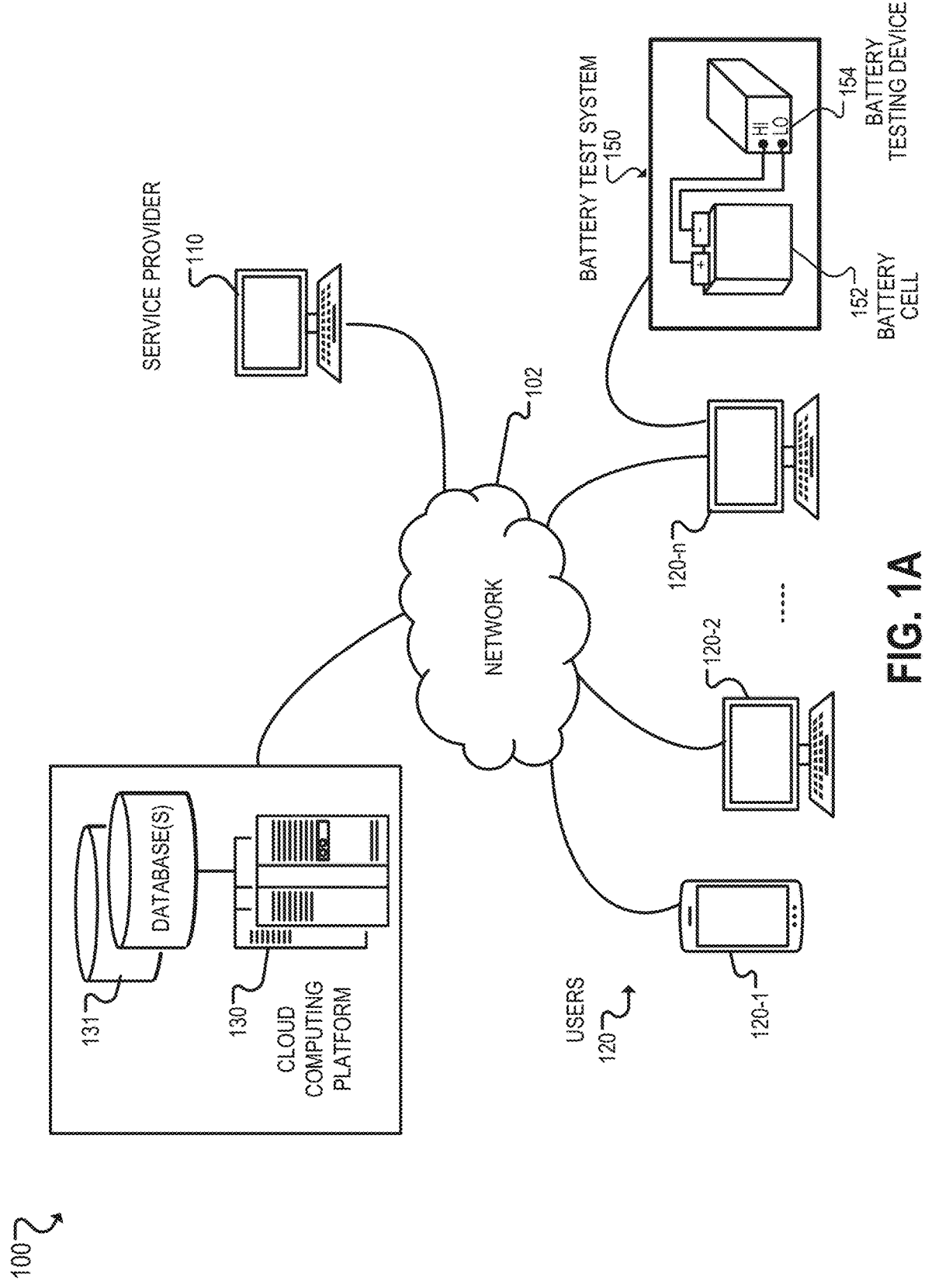
FIG. 1A is a schematic diagram of an example environment for battery performance prediction.

A battery can include one or more battery cells. Battery cell end-of-life (EOL) refers to the point at which a battery cell can no longer function effectively or meet the required performance standards for its application. EOL can be defined as when a battery cell reaches a threshold percentage (e.g., below 85%, below 80%, or below 70%) of its previous maximum discharge capacity. An accurate prediction of battery performance such as EOL cycles is important, as the predicted battery performance can help prevent dangerous situations (e.g., overheating, or even explosions) and schedule maintenance and replacement. Battery defects, e.g., catastrophic fade, may shorten the battery EOL. Catastrophic fade in a battery cell refers to a sudden and severe decline in performance and capacity of the battery cell. This phenomenon can be characterized by a rapid loss of the battery cell's ability to hold a charge and deliver power effectively. Catastrophic fade can render a battery cell virtually unusable in a short time frame, and can be an issue in applications where reliability and safety are critical, such as in electric vehicles or large-scale energy storage systems.

Implementations of the present disclosure provide a data-driven predictive modeling method for predicting battery performance, e.g., prediction of EOL cycle and/or identification of defective battery cells that show catastrophic fade much earlier before their lifetime expectancy. The method offers a straightforward, cost-effective, and time-efficient solution for rapidly predicting battery performance without prior knowledge of the battery chemistry and degradation mechanisms.

In some implementations, a Direct Current Internal Resistance (DCIR) test is conducted at various State of Charge (SOC) intervals (e.g., at various 10% SOC increments) during the discharge phase of a charge-discharge cycle. This test can be applicable over one or multiple charge-discharge cycles. In some implementations, the battery test data is gathered in early cycles, e.g., the second cycle and the $102^{nd}$ cycle of the lifetime of the battery cell. The DCIR test at these specific SOC intervals can be configured to capture comprehensive battery performance data across a range of operating conditions.

In some implementations, a first machine learning (ML) model is employed to predict EOL cycle of a battery cell. The first ML model can use any suitable algorithms, including without limitation to, Random Forest Regression, Regularized Regression, Nu Support Vector Regression. In some implementations, a second ML model is employed to predict catastrophic fade. The second ML model can include multilayer perceptron classifier (MLP), decision trees, random forests, neural networks, support vector machines (SVM) with nonlinear kernels, or gradient boosting machines. In some implementations, a single ML model is used to predict both EOL cycles and catastrophic fade. The ML model(s) can be trained to analyze the data obtained from the DCIR test and predict battery performance, e.g., EOL and/or catastrophic fade. This flexibility in the choice of machine learning architecture allows for adaptability and optimization in the data processing and analysis phase, facilitating accurate prediction of battery performance.

FIG. 1A is a schematic diagram of an example environment 100 for battery performance prediction. The operating environment 100 enables users (e.g., customers) to access a cloud computing platform, enables uses to upload their battery test data to the cloud computing platform for battery performance prediction.

In some implementations, the operating environment 100 includes service-side computing devices 110, user-side computing devices 120 (e.g., mobile device 120-1, or computer 120-2, ..., 120-n), a cloud computing platform 130, and a network 102. The service-side computing device 110 can be associated with a corresponding service provider (service company or business entity). The user-side computing devices 120 can be associated with one or more corresponding users. The network 102 can include a large computer network, such as a local area network (LAN), a wide area network (WAN), the Internet, a cellular network, or a combination thereof connecting any number of mobile computing devices, fixed computing devices and server systems. The service-side computing device 110 can be any type of devices, systems, or servers, e.g., a desktop computer, a mobile device, a smart mobile phone, a tablet computing device, a notebook, or a portable communication device.

The operating environment 100 can deploy a Software as a Service (SaaS) model.

SaaS is a software distribution model in which a cloud provider (e.g., the cloud computing platform 130) hosts applications and makes them available to end users over the network 102. In this model, an independent software vendor (ISV) (e.g., a service provider) may contract a third-party cloud provider (e.g., Amazon web services (AWS), Microsoft Azure, Google cloud platform (GCP)) to host the application (e.g., an application for battery performance prediction). Users can access the software through a web browser without needing to install or maintain it locally on their own computers. Examples of SaaS can include productivity tools like Google Workspace, customer relationship management (CRM) systems like Salesforce, and project management platforms like Asana. With larger companies, such as Microsoft, the cloud provider might also be the software vendor.

The cloud computing platform 130 can include one or more computing devices and one or more machine-readable repositories, or databases. In some implementations, the cloud computing platform 130 can include one or more server computers in a local or distributed network each having one or more processing cores. The cloud computing platform 130 can be implemented in a parallel processing or peer-to-peer infrastructure or on a single device with one or more processors. An example architecture for the cloud computing platform 130 is described in reference to FIG. 1B. The users can submit requests for services (e.g., request for predicting battery performance) to the cloud computing platform 130, and the service provider can offer battery performance prediction results to satisfy the users' requests for services. The cloud computing platform 130 can authenticate or verify qualification of the service provider and/or associated service.

The cloud computing platform 130 can store information of the service provider and information of the service, e.g., in one or more databases 131 coupled to the cloud computing platform 130. The service provider can register an account in the cloud computing platform 130 and enter or update the information of the service provider and/or the information of the service. For example, the service provider can provide a battery performance prediction application stored in the cloud computing platform 130. The users can upload their battery test data to the application for predicting battery performance, e.g., the battery's EOL cycles. Based on user's input data, the battery performance prediction application can automatically generate a EOL cycle prediction result for the battery cell by a first machine learning model. In some implementations, the battery performance prediction application includes a second machine learning model. The second machine learning model can predict whether the battery cell will experience catastrophic fade. The prediction result from the second machine learning model can indicate one of: i) the battery cell being a defective battery cell that will experience catastrophic fade, and ii) the battery cell being a normal battery cell that will not experience catastrophic fade. In some implementations, a single machine learning model in the battery performance prediction application can predict both EOL cycle of the battery cell and catastrophic fade. Using the battery performance prediction application, users can receive early predictions of EOL and/or the likelihood of catastrophic fade long before the expected end of the battery's lifespan. This enables users to take proactive measures, e.g., identifying defective battery cells for quality control, scheduling maintenance, and/or replacing battery cells before they fail.

The user-side computing devices 120 can include any appropriate type of device such as a laptop, a computer, tablet computing device, a handheld computer, a portable device, a mobile device, a personal digital assistant (PDA), a cellular telephone, a network appliance, a smart mobile phone, an enhanced general packet radio service (EGPRS) mobile phone, or any appropriate combination of any two or more of these data processing devices or other data processing devices. The user-side computing devices 120 can also refer to as remote computing device 120 in this disclosure.

In some implementations, the user-side computer devices 120 is coupled to a battery test system 150. The battery test system 150 can include one or more battery cells 152 and one or more battery testing devices 154. The battery testing devices 154 can perform pulse-based test, e.g., Direct Current Internal Resistance (DCIR) battery test, on the battery cells 152. As described with further details below in FIGS. 3-4B, the DCIR test protocol is designed to periodically evaluate the characteristics of the battery cells, e.g., capacity, internal resistance, voltage, and/or current, which are critical parameters for understanding battery performance.

In some implementations, the battery test data is received by the cloud computing platform 130 from a remote user computing device (e.g., computing device 120-n) that is coupled to the battery test system 150. The remoting computing device 120 is in communication with the cloud computing platform 130 through the network 102. In some implementations, the battery performance prediction application stored in the cloud computing platform 130 takes an action based on the prediction result for the battery cell. The action can include at least one of (i) transmitting the prediction result for the battery cell to the remote computing device 120 through the communication network, or (ii) presenting the prediction result for the battery cell on a web portal of the computing system to be accessible by the remote computing device. Alternatively, or in addition, the action taken by the cloud computing platform 130 can include: presenting at least one of i) the prediction result for the battery cell or ii) an indication of a quality control (QC) for the battery cell on a web portal of the computing system to be accessible by the remote computing device. As noted above, the prediction result indicates the EOL of the battery cell and/or whether the battery cell will experience catastrophic fade. In some implementations, the indications of QC for the battery cell includes, without limitation to, suggested root cause analysis (e.g., reviewing manufacturing record), corrective actions (e.g., replacing the battery cells, adjusting manufacturing processes, updating quality control procedures, or improving design present disclosures), isolation of the problem (e.g., isolating the problematic battery cell or cells from the rest of the batch or production line), suggested quality control analysis, and/or research and development (e.g., recommending new materials or new process flows).

Figure 1B:
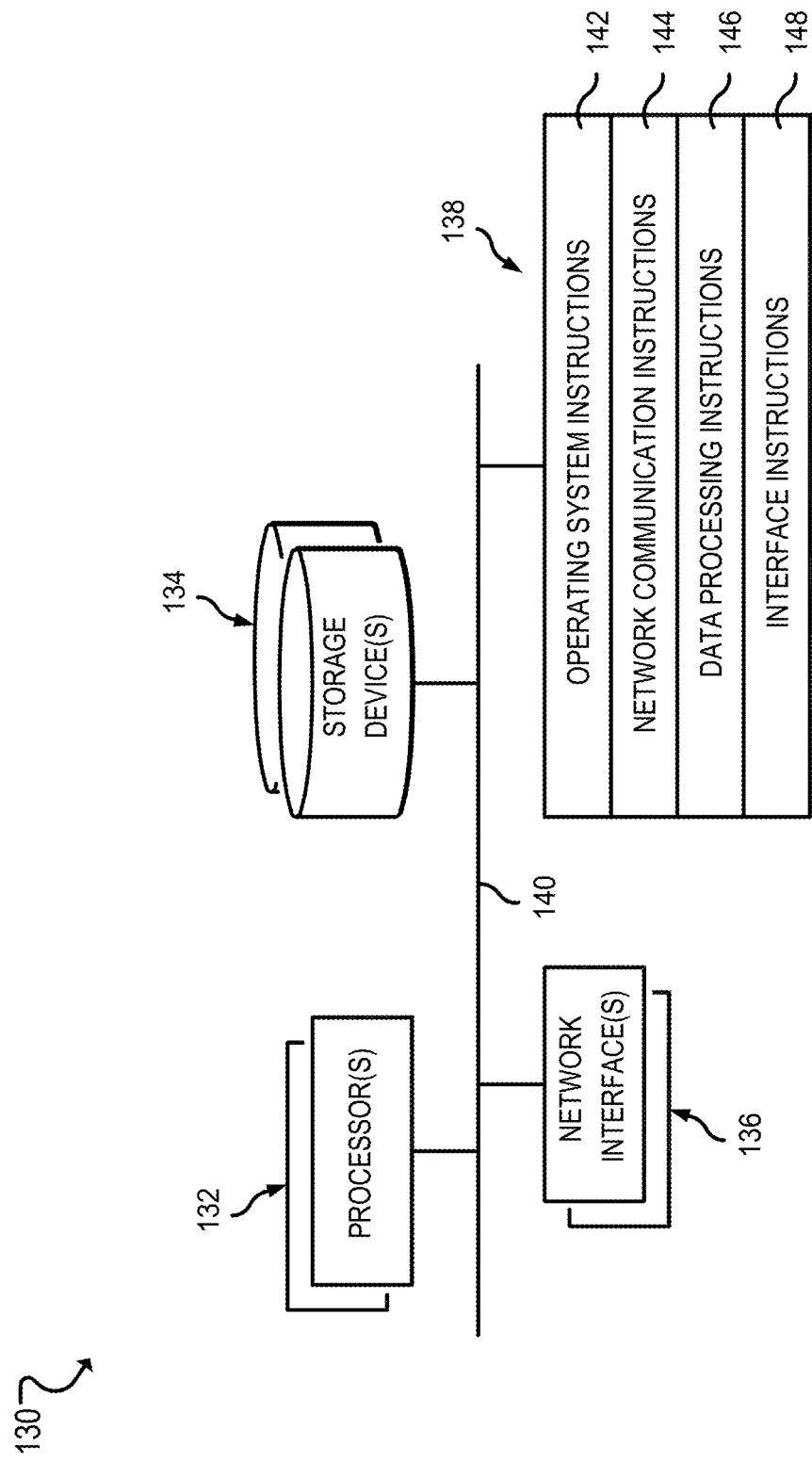
FIG. 1B is a schematic diagram of an example cloud computing system.

FIG. 1B is a schematic diagram of an example cloud computing system 130 described in reference to FIG. 1A. Other architectures are possible, including architectures with more or fewer components. In some implementations, the cloud computing system 130 includes one or more processors 132 (e.g., dual-core Intel® Xeon® Processors), one or more network interfaces 136, one or more storage devices 134 (e.g., hard disk, optical disk, flash memory) and one or more computer-readable mediums 138 (e.g., hard disk, optical disk, flash memory, etc.). These components can exchange communications and data over one or more communication channels 140 (e.g., buses), which can utilize various hardware and software for facilitating the transfer of data and control signals between components.

The term "computer-readable medium" refers to any medium that participates in providing instructions to processors 132 for execution, including without limitation, non-volatile media (e.g., optical or magnetic disks), volatile media (e.g., memory) and transmission media. Transmission media includes, without limitation, coaxial cables, copper wire and fiber optics.

Computer-readable mediums) 138 can further include operating system 142 (e.g., Mac OS® server, Windows® NT server, Linux Server), network communication module 144, interface instructions 146 and data processing instructions 148.

Operating system 142 can be multi-user, multiprocessing, multitasking, multithreading, real time, etc. Operating system 142 performs basic tasks, including but not limited to: recognizing input from and providing output to devices 132, 134, 136 and 138; keeping track and managing files and directories on computer-readable mediums 138 (e.g., memory or a storage device); controlling peripheral devices; and managing traffic on the one or more communication channel) 140. Network communications module 144 includes various components for establishing and maintaining network connections (e.g., software for implementing communication protocols, such as TCP/IP, HTTP, etc.) and for creating a distributed streaming platform using, for example, Apache Kafka™. Data processing instructions 146 include server-side or backend software for implementing the server-side operations, as described in reference to FIG. 1A. Interface instructions 148 includes software for implementing a web server and/or portal for sending and receiving data to and from user-side computing devices 120 and service-side computing devices 110, as described in reference to FIG. 1A.

The cloud computing system 130 can be included in any computer device, including one or more server computers in a local or distributed network each having one or more processing cores. The cloud computing system 130 can be implemented in a parallel processing or peer-to-peer infrastructure or on a single device with one or more processors. Software can include multiple software components or can be a single body of code.

Figure 2:
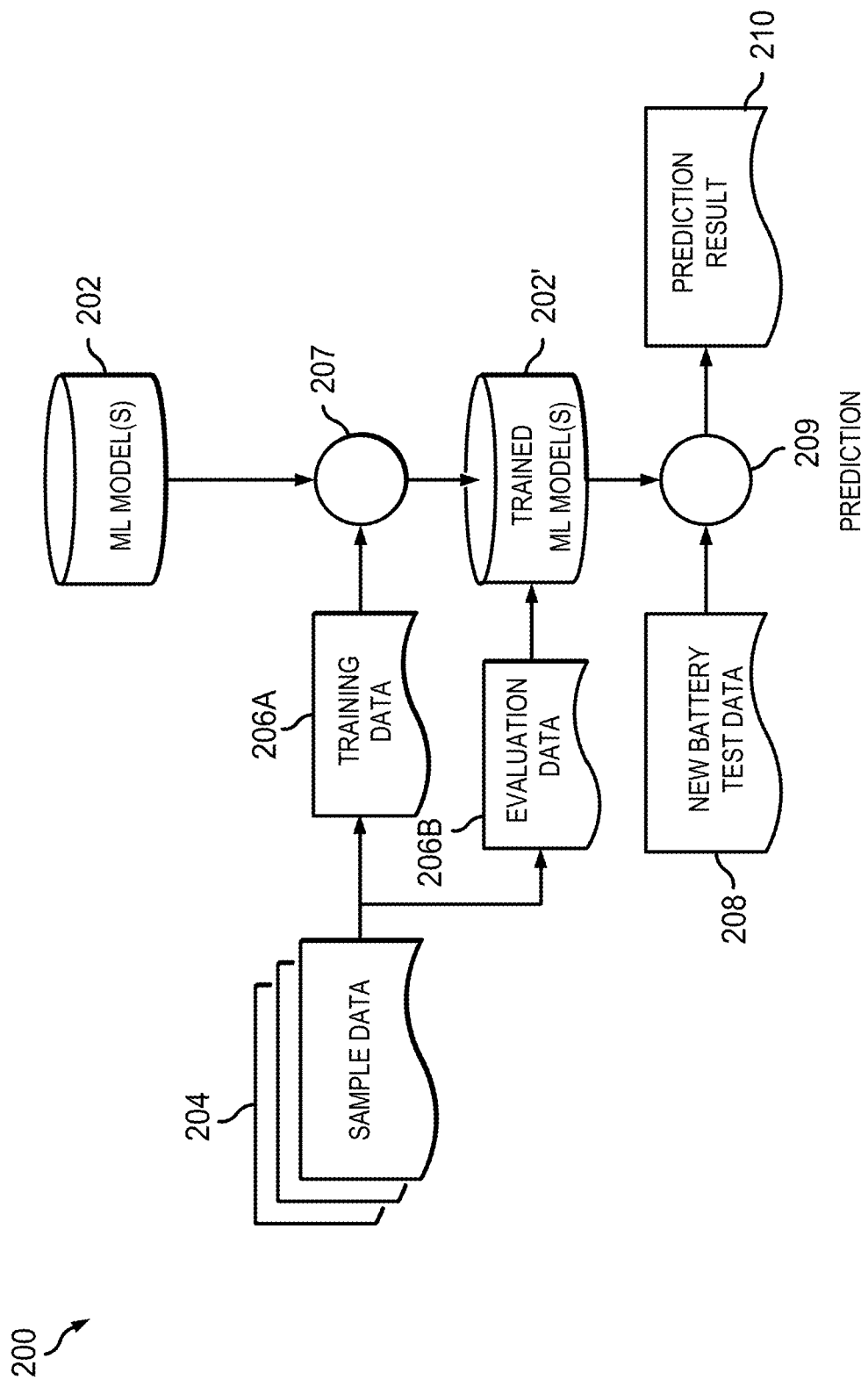
FIG. 2 is a schematic diagram illustrating an example of predicting battery performance based on a machine learning system.

FIG. 2 is a schematic diagram illustrating an example machine learning system 200 of predicting battery performance. The machine learning system 200 can include one or more machine learning models 202. The battery performance prediction can be implemented by a computing system (e.g., the cloud computing platform 130 of FIGS. 1A and 1B) that can include one or more computing devices and one or more machine-readable repositories or databases that are in communication with each other.

The computing system can receive battery test data of a battery cell from an end user and provide the battery test data of the battery cell as input to a machine learning model 202' running on the computing system to predict battery performance. The machine learning model 202' has been trained using training data 206A. The training data 206A can include data related to at least one battery cell property of at least two battery tests. Each battery test includes applying one or more pulses on the battery cell during a battery cycle in a DCIR test, as described below in further detail with reference to FIGS. 3-4B.

In response, the computer system (e.g., the battery performance prediction application stored in the computing platform) can automatically generate a prediction result 210 for the battery cell by the machine learning model 202'. The prediction result 210 can indicate an EOL cycle of the battery cell.

In some implementations, sample data 204 are prepared for training a machine learning model 202. The sample data 204 can include battery test data of a number of battery cells that reached respective end of life (EOL) cycles. In some implementations, the sample data 204 includes battery test data of battery cells having a range of EOL cycles, e.g., ranging from 500 cycles to 2000 cycles. The sample data 204 can be divided into training data 206A and evaluation data 206B.

The training data 206A can be separated into input parameters and output (or target) parameters for the training. The output parameters of the training data 206A can be the EOL cycle numbers. The input parameters of training data 206A can include, for each battery cell, data of at least one battery cell property of at least two battery tests. Each battery test includes applying one or more pulses on the battery cell during a corresponding battery cycle. For example, two battery tests can be conducted, e.g., during the second battery cycle (cycle 2) and the $102^{nd}$ battery cycle (cycle 102) of the lifetime of the battery cell, respectively. A number of pulses (e.g., 10 pulses) can be applied for each battery cycle.

In some implementations, the battery test data includes a difference of the battery cell property between the two battery tests during the time a pulse, e.g., a current pulse, is applied at the same particular state of charge. As described below in further detail with reference to FIG. 4B, in some implementations, the difference of the battery cell property between two cycles (e.g., between cycle 2 and cycle 102) includes at least one of a battery cell capacity change $\Delta Q_{m-n}(V)$, a ratio between a battery cell capacity change and a battery cell voltage $$\frac{dQ(V)}{V}m-n,$$

a ratio between a battery cell capacitance change and a battery cell voltage change $$\frac{dQ(V)}{dV}m-n,$$

a battery cell internal resistance change $\Delta R_{m-n}(V)$, a ratio between a battery cell internal resistance change and a battery cell voltage $$\frac{dR(V)}{V}m-n,$$

or a ratio between a battery cell internal resistance change and a battery cell voltage change $$\frac{dR(V)}{dV}m-n.$$

The subscripts m and n denote the cycle pairs used to calculate the battery cell properties. For example, m can be 102, referring to cycle 102, and n can be 2, referring to cycle 2. The difference can be calculated by subtracting the data of an earlier cycle from the data of a later cycle (e.g., cycle 102-cycle2), or subtracting the data of a later cycle from the data of an earlier cycle (e.g., cycle 2-cycle 102). In some implementations, summary statistics (also called characteristics in this disclosure) are obtained, e.g., mean, minimum, maximum, variance, skew, and kurtosis, for data points representing the difference of the battery cell property between the two battery tests.

The computer system can train a machine learning (ML) model 202 with respect to the training set 206A at a processing step 207 and return a trained ML model 202'. In some implementations, the machine learning model 202 includes a regression algorithm. The regression algorithm can include at least one of Random Forest Regression, Regularized Regression, or Nu Support Vector Regression.

In some implementations, after training the ML model 202 with the training data 206A, the trained ML model 202' is evaluated with the evaluation data 206B. The evaluation data 206B can provide independent measure of how well the trained ML model 202' has learned to make predictions or classifications on new, unseen instances. The battery test data of evaluation data 206B can be conformed with respect to properties of the battery cells as the training data 206A. For example, both the training data 206A and the evaluation data 206B can include summary statistics of data points representing the difference in battery cell properties between two battery tests conducted at two battery cycles.

In some implementations, both the training data 206A and the evaluation data 206B are collected during cycle 2 and cycle 102 of the lifetime of the battery cell. The predicted result of the ML model 202' using evaluation data 206B can be compared to the ground truth EOL cycle values. In some implementations, the metric used to evaluate the performance of the ML model 202' is root mean square error (RMSE) between predicted EOL cycles and the actual EOL cycles. Based on the result of evaluation (e.g., RMSE), one or more parameters of the trained ML model 202' can be adjusted to further train the ML model 202'.

At a processing step 209, the computing system can use the trained ML model 202' together with new battery test data 208 of battery cells to be predicted that is provided by end users to jointly predict battery performance of the battery cells. The battery test data 208 from end users can be conformed with respect to properties of the battery cells as the training data 206A. For example, the new battery test data 208 can include summary statistics data (e.g., mean, minimum, maximum, variance, skew, and/or kurtosis) associated with a difference of the battery cell property of two battery tests at two battery cycles. In some implementations, the six summary statistics data are calculated for each of the ten pulses during a battery cycle for a single cell property (e.g., $\Delta Q_{m-n}(V)$), yielding 6×10=60 input parameters. In some implementations, a difference in battery test data between cycle 2 and cycle 102 are used for prediction. In some implementations, the prediction result 210 indicates an EOL cycle of the battery cell.

In some implementations, one or more parameters of the ML model 202' are updated based on the battery test data 208 of the battery cell and the prediction result 210 for the battery cell. For example, the battery test data 208 provided by end users and the corresponding prediction results can be additionally used as the training data 206A to further train or refine the ML model 202', returning an updated trained ML model 202'. End user data may contain specific patterns or anomalies relevant to their use case or environment. By incorporating this data into the training process, the ML model 202 can be customized to better suit the needs of the end users. The diversity of the training data can also be increased.

In some implementations, the machine learning model for battery EOL prediction is a first machine learning model. In some implementations, the machine learning system 200 includes a second machine learning model used to predict whether the battery cell will experience catastrophic fade.

In some implementations, the second machine learning model is trained using the same input parameters of training data 206A for the first machine learning model, e.g., summary statics of data points representing the difference in battery cell properties between two battery tests conducted at two battery cycles. The sample battery cells used for training can include first battery cells that experienced catastrophic fade and second battery cells that have a normal lifetime without experiencing catastrophic fade. The battery cells with normal lifetime of a battery cell can refer to the battery cells that gradually degrade as it undergoes numerous cycles of charging and discharging, eventually dropping to a threshold percentage (e.g., below 85%, below 80%, or below 70%) of its previous maximum discharge capacity. In contrast, a defective battery cell with catastrophic fade may rapidly lose over 20% of its total capacity within less than 1% of its expected lifecycle in terms of charge-discharge cycles. Alternatively, a catastrophic fade in a battery cell, e.g., in a lithium-ion battery cell, can be defined numerically as a loss of over 30% of its total capacity within less than 5% of its expected lifecycle in terms of charge-discharge cycle or as a loss of over 25% of its total capacity within less than 5% of its expected lifecycle in terms of charge-discharge cycles.

In some implementations, the output parameters of the training data 206A include a binary label. For example, the binary label 1 indicates the battery experienced a catastrophic fade, while the binary label 0 indicates the battery did not experience a catastrophic fade.

In some implementations, the second machine learning model is trained using only a single battery cycle data. The single battery cycle data can be from one of the at least two battery cycles used to train the first ML model 202. For example, the training data 206A for the first ML model 202 can involve DCIR test data from cycle 2 and cycle 102. Rather than using the same data from both cycles, only the test data from cycle 2 may be reused for training the second ML model. In some implementations, the single cycle is within the first 10 cycles of the lifetime of the battery cell. In some implementations, the single battery cycle is the 2nd battery cycle of the lifetime of the battery cell. In some implementations, the battery test data for the single battery cycle includes internal resistance.

In some implementations, the same set of battery test data 208 from users is used as input for both the first ML model for EOL cycle prediction and the second ML model for catastrophic fade prediction. In response to receiving the new battery test data 208, the first ML model can automatically generate a first prediction result indicating an EOL cycle of the battery cell, while the second ML model can automatically generate a second prediction result for the battery cell.

In some implementations, the second prediction result indicates one of: i) the battery cell being a defective battery cell that will experience catastrophic fade, and ii) the battery cell being a normal battery cell that will not experience catastrophic fade. In some implementations, the computer system takes a second action based on the second prediction result for the battery cell. In some implementations, the second action includes transmitting at least one of i) the prediction result for the battery cell or ii) an indication of a quality control (QC) for the battery cell to the remote computing device through the communication network. In some implementations, the indications of QC for the battery cell includes, without limitation to, suggested root cause analysis (e.g., reviewing manufacturing record), corrective actions (e.g., replacing the battery cells, adjusting manufacturing processes), and/or research and development (e.g., recommending new materials or new process flows). In some implementations, the second machine learning model includes at least one of Multilayer Perceptron Classifier (MLP), support vector machines (SVM) with nonlinear kernels, Decision Trees, Random Forests, artificial neural network, or gradient boosting machine (GBM).

In some implementations, a single ML model 202 is used to predict both battery EOL cycle and catastrophic fade. This single ML model can be trained using the same training data 206A as described above. In some implementations, the prediction result of this single ML model includes (i) a predicted EOL cycle number and (ii) an indication of: the battery cell being a defective battery cell that will experience catastrophic fade, or the battery cell being a normal battery cell that will not experience catastrophic fade. For example, the indication for catastrophic fade can be a binary label, where the binary label 1 indicates the battery will experience a catastrophic fade, while the binary label 0 indicates the battery will not experience a catastrophic fade.

In some implementations, the prediction of catastrophic fade is based on the predicted EOL cycle number. For example, a predicted EOL cycle below a first predetermined threshold can indicate the battery will experience catastrophic fade. Conversely, a predicted EOL cycle that is above a second predetermined threshold can indicate the battery cell will not experience catastrophic fade. In some implementations, the first predetermined threshold is equal to the second predetermined threshold, e.g., around 1000 cycles. In some implementations, the first predetermined threshold is around 700 cycles, and the second predetermined threshold is around 1300 cycles.

Different ML models can be trained for different types of battery cells. The ML model 202' can be a first ML model trained for battery performance prediction for a first type of battery cells. In some implementations, another ML model running on the computing system is trained for battery performance prediction for a second type of battery cells. The first type of battery cells and the second type of battery cells can have different battery cell chemistry. Some types of battery cell chemistry may be more susceptible to catastrophic fade than others due to varying structural characteristics, thermal stability or chemical reactions. For instance, lithium-ion batteries may be more susceptible to thermal runaway and/or catastrophic fade under conditions such as overcharging or high temperature. In contrast, lead-acid batteries may be less susceptible to catastrophic fade. To address this challenge, ML models 202 can be tailored and trained for specific battery types to enhance prediction accuracy.

In some implementations, the ML model 202 is trained for battery performance prediction for two or more types of battery cells that have different battery cell chemistry. For example, the ML model 202 can be trained for both lithium-ion batteries and lead-acid batteries. A single model trained on multiple types of battery cells can be applied across various industries and applications. Such ML model can learn robust features that are relevant across different types of battery cells. This can enhance prediction performance for battery cells with variations and complexities.

Figure 3:
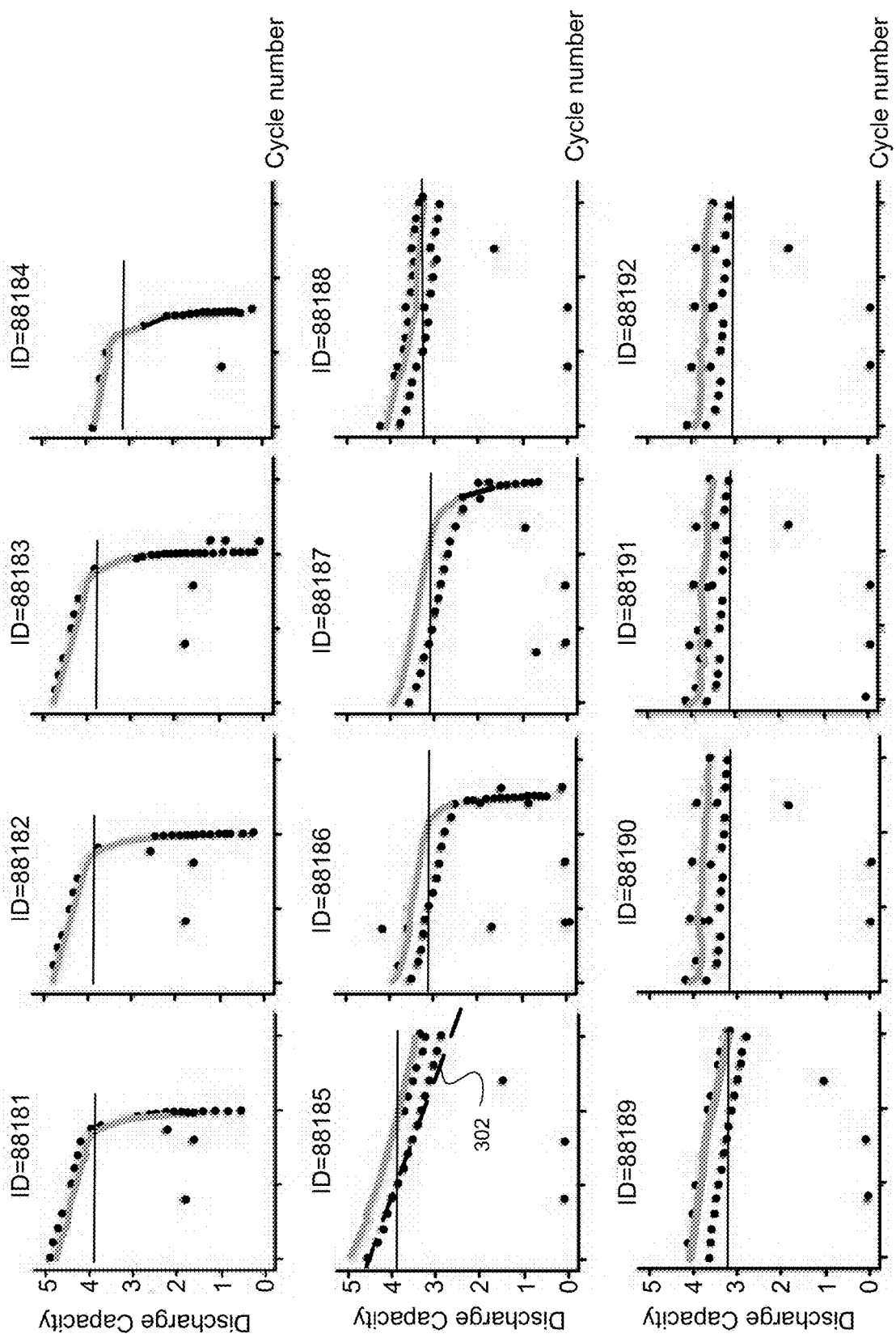
FIG. 3 illustrates example curves for battery discharge capacity versus a number of cycles for different battery cells.

FIG. 3 illustrates example curves for battery discharge capacity versus a number of cycles for different battery cells. Each battery cycle includes a charging portion and a discharging portion. In the present example, in the charging portion, the sample battery cells are charged from a lower voltage (e.g., 3.0 V) to a higher voltage (e.g., 4.2 V), while in the discharging portion, the battery cells are discharged from the higher voltage down to the lower voltage.

Batteries may degrade gradually in a linear way as undergoing numerous cycles of charging and discharging cycles. The end-of-life (EOL) of batteries can be defined as when the cell reaches a threshold percentage (e.g., below 85%, below 80%, or below 70%) of its previous maximum discharge capacity. In some situations, batteries degrade in a non-linear way, e.g., a catastrophic fade. The nonlinear behavior can be characterized by a rapid decline in performance. In some implementations, as noted above, the catastrophic fade in a battery cell can be defined numerically as a loss of over 20% of its total capacity within less than 1% of its expected lifecycle in terms of charge-discharge cycles.

For the example battery cells used in FIG. 3, the cell composition includes a graphite/silicon alloy anode, Lithium-Nickel-Manganese-Cobalt-Oxide (NMC) cathodes, and an electrolyte comprising $LiPF_6$ carbonates. These battery cells are configured in the 18650 cylindrical formats with a capacity of approximately 1 Ah. These battery cells are subjected to cycling between predefined voltage thresholds, e.g., at 4.2 V and 3.0 V, with consistent charge and discharge rate of 1 C.

During battery charge-discharge cycles, continuous monitoring and recording of the battery cell's voltage and current are carried out to generate a discharge voltage curve for each cell, as depicted in FIG. 3, showing 12 sample battery cells. Among them, six cells show catastrophic fade, e.g., battery ID 88181, 88182, 88183, 88184, 88186 and 88187. It is to be understood that battery cells may eventually nosedive (e.g., decline rapidly) after reaching its knee point at its expected EOL. Catastrophic fade occurs when a battery cell reaches its knee point before its expected EOL. Therefore, the prediction of battery cell's tendency to nosedive becomes crucial to enhance product reliability.

In some implementations, during the first cycle, standard charging and/or discharging are performed. The standard charge and discharging rate can be specified by the manufacturer and depend on the type and chemistry of the battery. For example, lithium-ion batteries can have standard charge/discharge rates ranging from 0.3 C to 1 C. Subsequently, in the second cycle, a DCIR test is implemented, as described with further details below in FIGS. 4A and 4B. Following this, from the third cycle to the 101st cycle, the battery cells are subjected to standard charging and discharging cycles. However, during the 102nd cycle, another DCIR test is applied to the battery cells. This cyclic pattern may be reiterated multiple times. In some implementations, the DCIR test is applied every 100 cycles.

In some implementations, the DCIR test data from the second cycle and the $102^{nd}$ cycle data are used as the training data 206A. Accordingly, the evaluation data 206B or new battery test data 208 can include the DCIR test data from the same two cycles. In some implementations, the first DCIR test is conducted on battery cells within the first 100 cycles.

In some implementations, more than 10, more than 100, or more than 1000 sample battery cells are used to collect DCIR test data. In some implementations, the test data for the sample battery cells are divided into at least two groups, training data 206A, and evaluation data 206B. As described above in reference to FIG. 2, the training data 206A can be used to train the ML model 202, and the evaluation data 206B can be used to evaluate how well the trained ML model 202' has learned to make predictions or classifications on new, unseen instances.

Figure 4A:
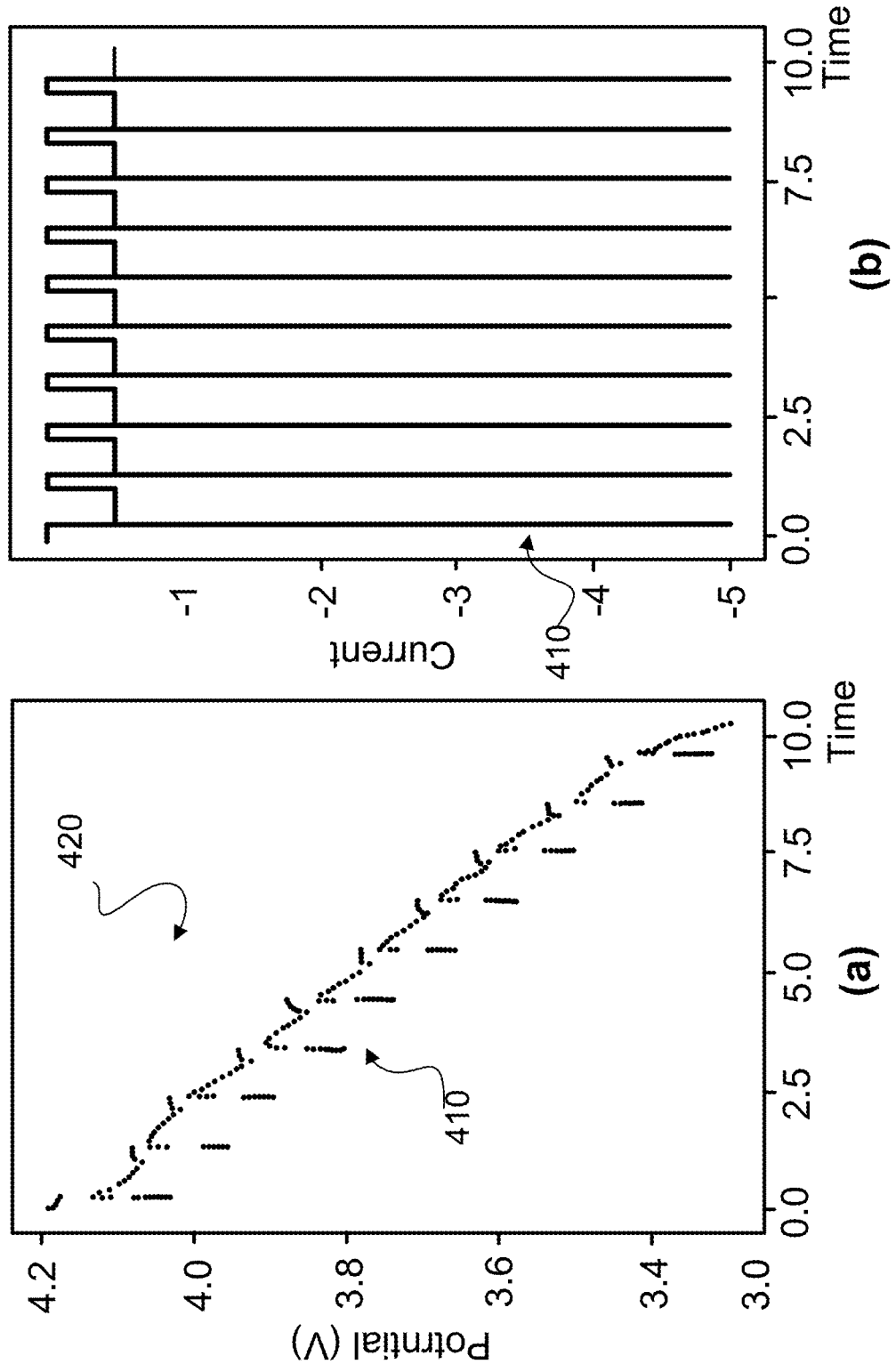
FIG. 4A illustrates example DCIR testing at a discharge portion of a battery cycle.

FIG. 4A illustrates example DCIR testing at a discharge portion of a battery cycle. During battery test, a cycling protocol incorporating DCIR checkup cycles can be employed, e.g., to monitor and assess the health and performance of the battery cells throughout their operational life. This protocol is designed to periodically evaluate the characteristics (e.g., charge, voltage, current, or internal resistance) of the battery cell for understanding battery performance efficiency. In some implementations, a DCIR checkup cycle is initiated every 100 cycles throughout the lifetime of the battery, beginning at cycle 2. Each DCIR checkup cycle can include a series of 10 discrete pulses administered at varying states of charge (SOC), decrementing in 10% intervals from 90% to 0%. These pulses can be controlled to minimize disruption to the battery's regular usage cycle, ensuring that the diagnostic process does not adversely affect the battery's performance or lifespan.

In some implementations, before the DCIR test, the battery cells can be initially discharged to a certain state, referred to as the "discharged state." After reaching the discharged state, the battery cells can be then charged to their maximum voltage (e.g., Vmax 4.2V). This standard charging process is performed, for example, using a charging rate of C/3 with constant current (CC) and a manufacturer-recommended constant voltage (CV) hold. Following the charging process, a 1-hour rest period is conducted. This one-hour rest at open-circuit immediately prior to the DCIR test can allow the battery to reach electrochemical and thermal equilibrium. After the rest period, the battery cells can start the DCIR test.

As noted above, a battery cycle includes a charging portion and a discharging portion 420. In some implementations, in the charging portion, the battery cells are charged from 3.0 V to 4.2 V, while in the discharging portion, the battery cells are discharged from 4.2 V down to 3.0 V. With reference to diagram (a) of FIG. 4A, in some implementations, the DCIR test is conducted during the discharging portion 420 of a battery cycle. In some implementations, the DCIR test applies a plurality of discharging pulses 410 during the discharging portion 420, e.g., as illustrated in diagram (b) of FIG. 4A. In some implementations, the battery test includes applying each of a plurality of discharging pulses (e.g., current pulses) on the battery cell when the capacity of the battery cell is changed from a respective charge by the predetermined percentage of state of charge (SOC). In some implementations, the predetermined percentage of SOC is 10%. In other words, the discharging pulse 410 can be applied at each 10% depth-of-discharge increment (as determined from the beginning of life rated capacity), decrementing from a fully charged state (e.g., 4.2 V), and ending at a 90% discharged state (e.g., 3.1 V). Therefore, a battery cell can be subjected to a total of ten discharging pulses 410 for each charge-discharge cycle. These ten pulses, applied at specific cycle intervals, can induce voltage drops that form mini-Q(V) curves 430, as illustrated below in FIG. 4B.

In some implementations, the HPPC test can be performed in the following manner. After a charging portion, the battery cell rests for 15 minutes at an open circuit, and then a 1 C discharging pulse (e.g., the discharging pulse 410) is applied for 30 seconds. Following the discharging pulse, the battery cell is discharged at a rate of C/10 until it reaches 90% SOC. When the battery cell reaches 90% SOC, the battery cell is again allowed to rest at the open circuit for 15 minutes, and then another 1 C discharging pulse is applied for 30 seconds. Following the discharging pulse, the battery cell is discharged at a rate of C/10 until it reaches 80% SOC. This process repeats every 10% SOC until the battery cell is fully discharged.

In some implementations, at least one portion of the battery cycle, e.g., a discharging portion, has multiple periods associated with the predetermined percentage of SOC (e.g., 90%, 80%, . . . , 10%). Each of the current pulses can be a current discharging pulse 410 applied in the respective period.

In some implementations, at least two battery tests are conducted. The at least two battery tests include a first battery test during a first battery cycle and a second battery test during a second battery cycle that is later than the first battery cycle in the lifetime of the battery cell. In some implementations, the first battery cycle and the second battery cycle are within about first 100 cycles of the lifetime of the battery cell. In some implementations, an interval between the first battery cycle and the second battery cycle is about 100 cycles. In some implementations, the first battery cycle is within first 10 cycles of the lifetime of the battery cell. For example, the first battery cycle can be cycle 2, e.g., the 2nd cycle of the lifetime of the battery cell, and the second battery cycle can be cycle 102.

Figure 4B:
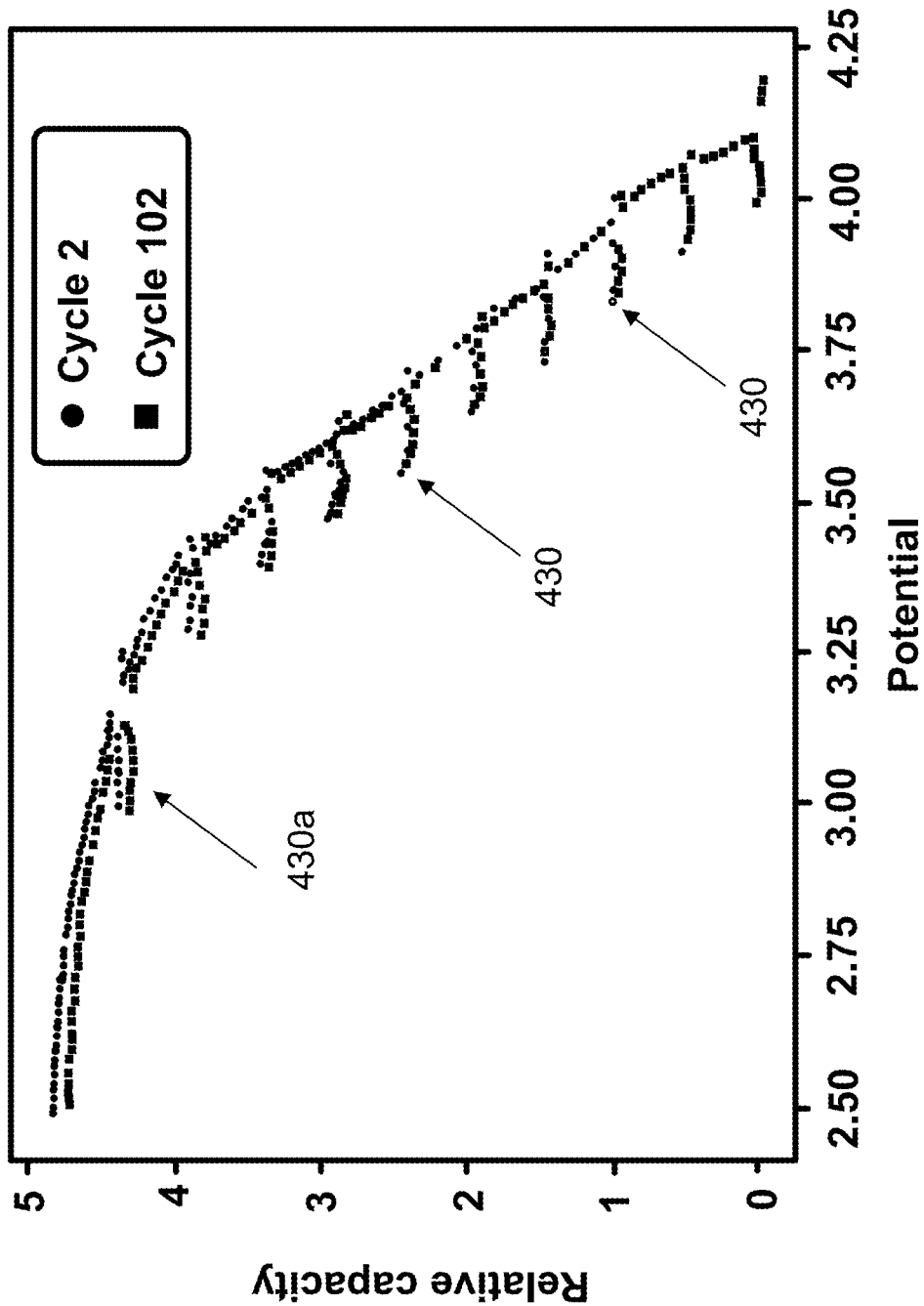
FIG. 4B illustrates example Q(V) curves for DCIR checkup cycle 2 and 102.

FIG. 4B illustrates example Q(V) curves for DCIR checkup cycle 2 and 102. In the coordinate system, the horizontal axis represents potential, whereas the vertical axis represents capacity. For each battery cycle, 10 current pulses are applied to the battery cell, resulting in 10 mini-Q(V) curves 430. In some implementations, a difference of at least one cell property between cycle 2 and cycle 102 are obtained for each pulse or each mini-Q(V) curve 430. The cell property can include at least one of, without limitation to:

(1) a battery cell capacity change, denoted as $\Delta Q_{m-n}(V) = Q_m(V) - Q_n(V)$;

(2) a ratio between a battery cell capacity change and a battery cell voltage, denoted as $$\frac{dQ(V)}{V} m - n = \frac{dQ_m(V)}{V_m} - \frac{dQ_n(V)}{V_n};$$

(3) a ratio between a battery cell capacity change and a battery cell voltage change, denoted as $$\frac{dQ(V)}{dV} m - n = \frac{dQ_m(V)}{dV_m} - \frac{dQ_n(V)}{dV_n};$$

(4) a battery cell internal resistance, denoted as $\Delta R_{m-n}(V) = R_m(V) - R_n(V)$. The internal resistance R can be determined using equation $$R = \frac{V_{t0} - V_{t1}}{I_{t1} - I_{t0}},$$

where $V_{t0}$ is the respective battery voltage before each discharging pulse is applied (e.g., 90% of Vmax, 80% of Vmax, ..., 10% of Vmax) and Vu is the battery voltage after discharges finishes but before the rest period starts. Similarly, $I_{t0}$ is the battery current before discharge begins, $I_{t1}$ is the discharge current of the discharging pulse 410.

(5) a ratio between a battery cell internal resistance change and a battery cell voltage, denoted as $$\frac{dR(V)}{V} m - n = \frac{dR_m(V)}{V_m} - \frac{dR_n(V)}{V_n};$$

or (6) a ratio between a battery cell internal resistance change and a battery cell voltage change, denoted as $$\frac{dR(V)}{dV} m - n = \frac{dR_m(V)}{dV_m} - \frac{dR_n(V)}{dV_n},$$

where subscripts m and n denote cycle numbers. For example, m can be 102, referring to cycle 102, and n can be 2, referring to cycle 2.

For each mini-Q(V) curve 430, a plurality of data points can be measured as illustrated in the FIG. 4B. Therefore, for each mini-Q(V) curve 430, a plurality of data points can be obtained for the difference between cycle 2 and cycle 102. For instance, for pulse #1 corresponding to the mini-Q(V) curve 430a, N data points can be collected (N>=1). The difference in battery cell capacity between cycle 2 and cycle 102 for pulse #1 can be calculated by subtracting each data point in the mini-Q(V) curve 430a of cycle 2 from its corresponding data point in the mini-Q(V) curve 430a of cycle 102. This yields N data points of $\Delta Q_{102-2}(V)$ for pulse #1, representing the difference of mini-Q(V) curves 430a between two cycles. A similar calculation can be performed for the remaining nine mini-Q(V) curves. Therefore, in the present example, each battery cell can generate a total of 10×N data points of $\Delta Q_{102-2}(V)$ for all 10 mini-Q(V) curves, with each mini-Q(V) curves having N data points.

After $\Delta Q_{102-2}(V)$ between two cycles are obtained, characteristics can be calculated based on the N data points of $\Delta Q_{102-2}(V)$ for each pulse. The characteristics of data points include at least one of the summary statistics, e.g., skew, kurtosis, variance, mean, minimum, or maximum. The characteristics can be calculated for each pulse and for each individual cell property. For example, a battery cell can have 10 data points for mean of $\Delta Q_{102-2}(V)$ corresponding to the 10 pulses, 10 data points for minimum of $\Delta Q_{102-2}(V)$ corresponding to the 10 pulses, 10 data points for maximum of $\Delta Q_{102-2}(V)$ corresponding to the 10 pulses, and so on. Calculating all six statistics provides a total of 60 data points (e.g., 6×10=60) for a battery cell for a single cell property (e.g., $\Delta Q_{102-2}(V)$). Similarly, another cell property (e.g., can $$\frac{dQ_{102-2}(V)}{V_{102-2}})$$

provide an additional 60 data points. In some implementations, all six summary statistics are calculated for all six cell properties that are discussed above, which yield a total of 360 data points as input features (e.g., 60×6=360) to the ML model 202'. Although $\Delta Q_{102-2}(V)$, cycle 2 and cycle 102 are used as references in the description above, it is to be understood that the DCIR battery tests can also be performed during other cycles and/or for different battery properties.

In some implementations, each characteristic of each mini-Q(V) curve 430 is used as a respective input feature to the machine learning model. A number of the input features of the input to the machine learning model can be identical to or greater than a product of a number of the one or more characteristics and a number of the one or more pulses. For example, in example implementations where the characteristics are calculated for a single cell property (e.g., $\Delta Q_{102-2}(V)$) based on differences between cycle 2 and cycle 102, the number of the input features to the ML model 202 can be equal to a product of the number of characteristics (e.g., 6 for skew, kurtosis, variance, mean, minimum, and maximum) and a number of the pulses (e.g., 10), resulting in a total number of 60. On the other hand, if the characteristics are calculated for two cell properties (e.g., $\Delta Q_{102-2}(V)$ and $$\frac{dQ_{102-2}(V)}{V_{102-2}}),$$

the number of input features can be 120, e.g., a sum of 60 for $\Delta Q_{102-2}(V)$ and 60 for $$\frac{dQ_{102-2}(V)}{V_{102-2}}.$$

Therefore, the number (e.g., 120) of the input features to the ML model 202' can be greater than a product (e.g., 60=6×10) of a number of the characteristics and a number of the pulses. In some implementations, a number of the input features to the ML model 202' is equal to a product of (i) a number of the characteristics, (ii) a number of the pulses in a battery cycle, and (iii) a number of cell properties. In the example above where two cell properties are calculated, the number of the input features (e.g., 120) is determined by multiplying 6 (the number of characteristics) by 10 (the number of pulses) by 2 (the number of cell properties). In some implementations, e.g., as described with further details in FIG. 7, other cell properties can be also used as input features for battery performance prediction. In some implementations, the machine learning model is trained based on all the input features.

Although not shown, it is to be understood that the DCIR test can be conducted in the charging portion of a charge-discharge cycle. It is further to be understood that the battery test can include any other pulse-based test, e.g., minimum pulse power characterization (MPPC) test, or Hybrid Pulse Power Characterization (HPPC) test. MPPC can subject the battery to short pulses of current at varying current levels, measuring the voltage response to evaluate performance. However, MPPC distinguishes from DCIR by allowing for variability in pulse parameters such as amplitude, duration, or frequency. HPPC testing substantially resembles DCIR, which involves a series of short-duration, high-current pulses at different states of charge (SOC), and the battery's voltage response is measured during the HPPC test.

FIG. 5 is a table showing example battery EOL cycle prediction results with different regression models. Three examples are evaluated using different regression models: Nu Support Vector regression, regularized regression (elastic net), and random forest regression. In each example, data points are collected to measure the difference in Q (v) between cycle 2 and cycle 102, and six characteristics of the data points are computed: mean, minimum, maximum, skewness, kurtosis, and variance. The metric for evaluating the performance of each regression model is root mean square error (RMSE) and standard deviation (std). As shown in FIG. 5, example 3 with random forest regression model yields the lowest RMSE 122, outperforming the other two regression models. A lower RMSE can indicate a more accurate prediction of the battery's end-of-life (EOL) cycle. The random forest regression model also has a better std compared to the regularized regression model. This indicates the random forest regressor, enhanced by sequential feature selection, can have a better performance at interpreting the complex relationships between the ΔQ(V) characteristics and the battery's overall health and cycle life.

Figure 6A:
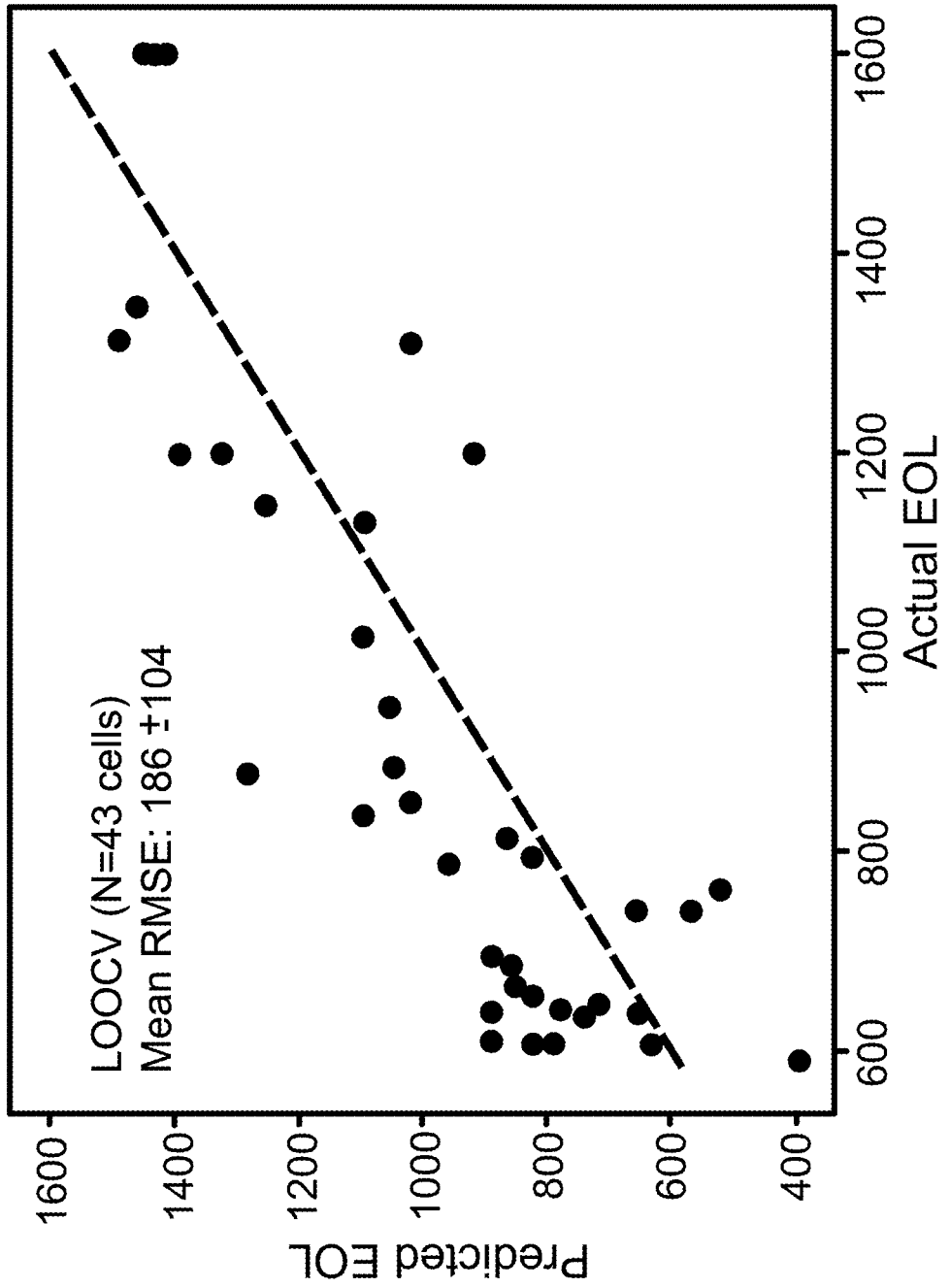
FIGS. 6A, 6B and 6C show plots of predicted EOL cycles versus actual EOL cycles for three examples shown in FIG. 5.
Figure 6B:
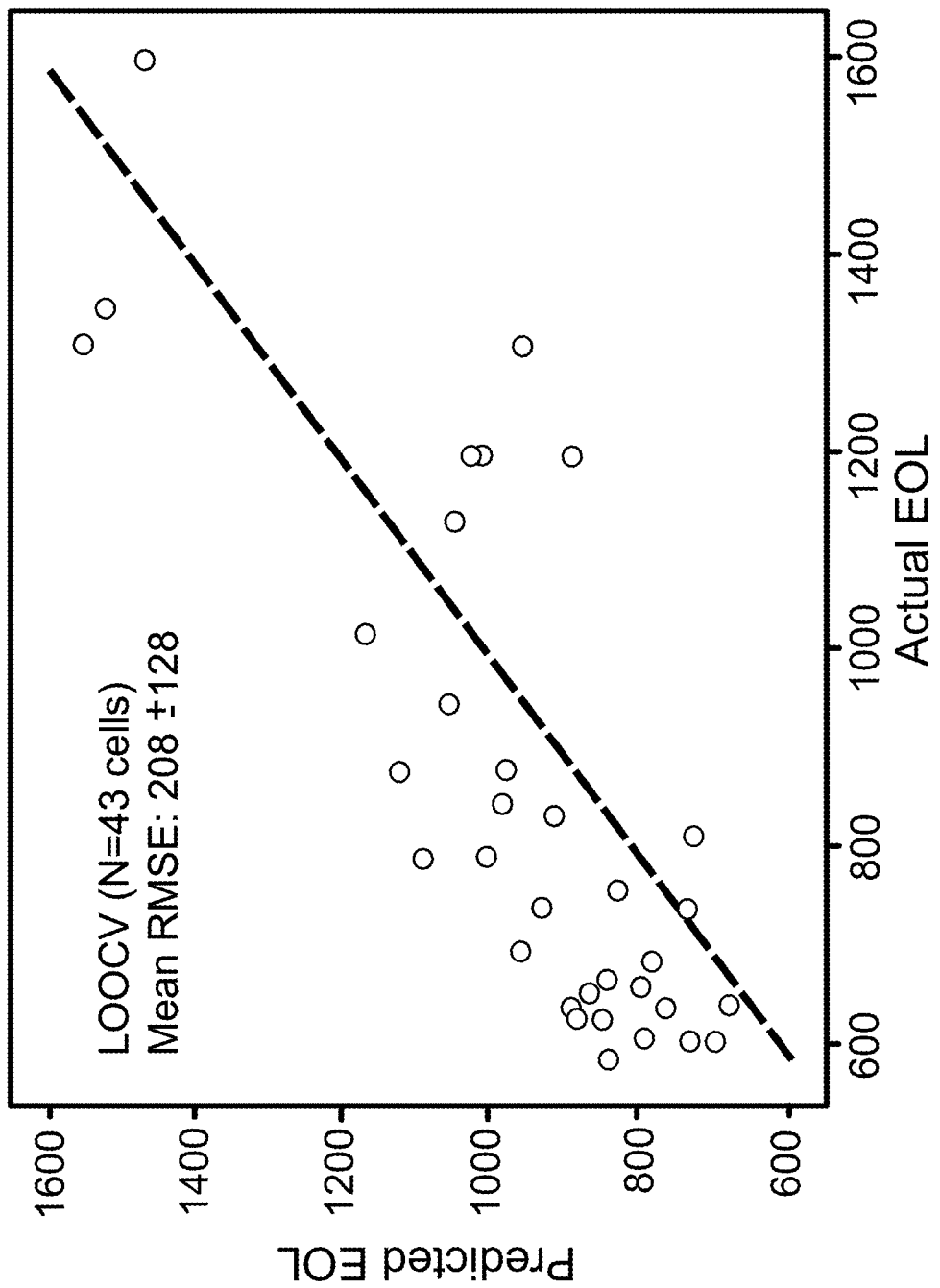
Figure 6C:
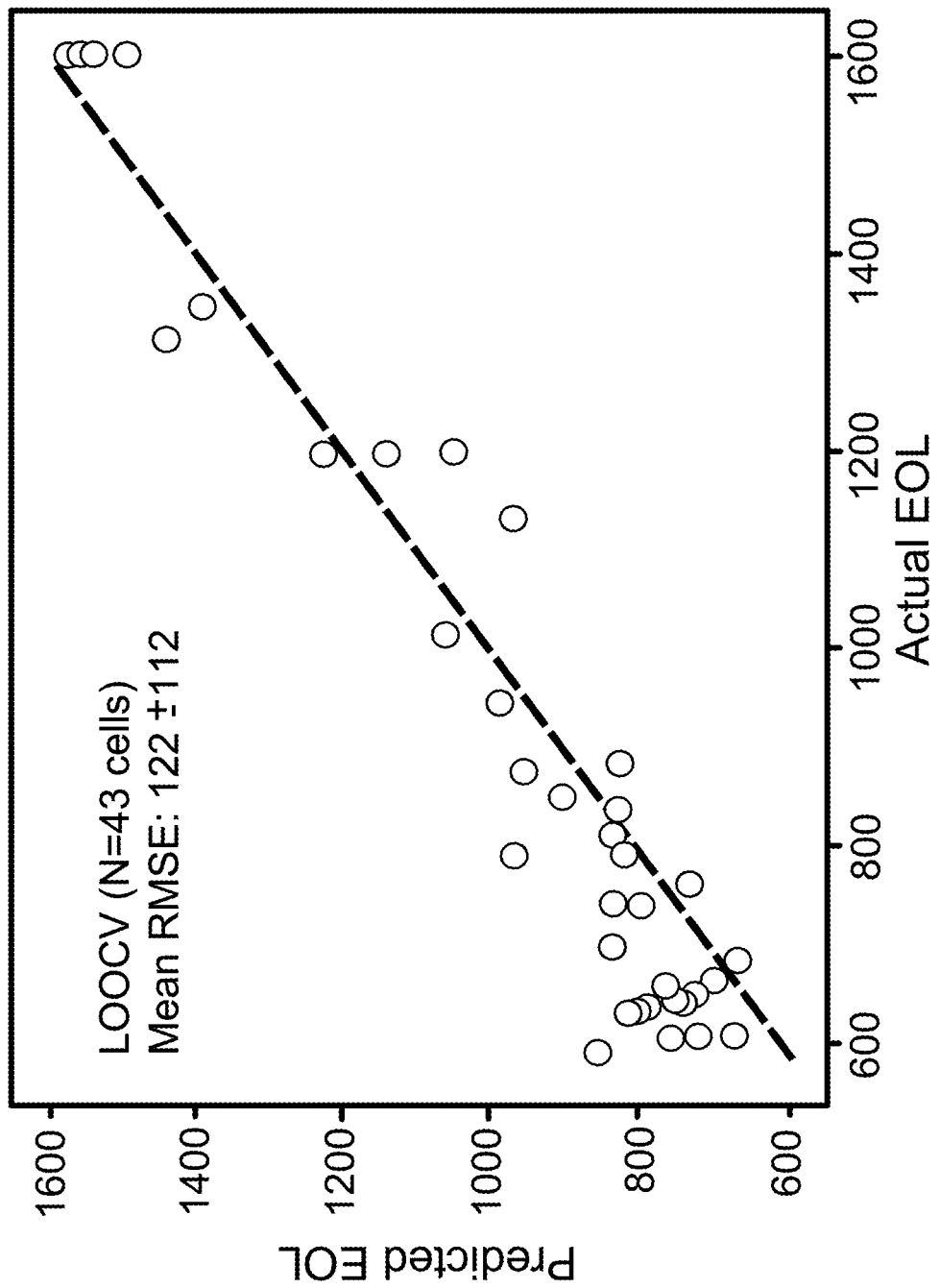

FIGS. 6A, 6B and 6C show plots of predicted EOL cycles versus actual EOL cycles for the three examples shown in FIG. 5. In particular, FIG. 6A shows a parity plot for the Nu Support Vector regression model. FIG. 6B shows a parity plot for the regularized regression model. FIG. 6C shows a parity plot for the random forest regression model. X axis in each plot represents actual EOL cycles, ranging from about 600 cycles to about 1600 cycles, while Y axis represents predicted EOL cycles within a similar range. RMSE is calculated for each regression model to measure the difference between the predicted and actual EOL values. Each example uses data from about 43 battery cells. As shown, the random forest model in FIG. 6C exhibits a more linear relationship between the predicted and actual EOL values with the lowest RMSE, indicating more accurate prediction results among the three samples. Therefore, implementation of the present disclosure can provide accurate battery EOL prediction results with RMSE just around 122 cycles. As noted above, accurate battery EOL prediction can improve safety by reducing risk of overheating or leakage, and save manufacturing cost by proactively scheduling replacement or maintenance.

FIG. 7 illustrates a table showing metrics computed from a combination of different regression models and input features. The regression models used in these examples are random forest regressor and elastic net. Different types of input features are described as follows:

(1) Linear curve fitting: between two early cycles, e.g., cycle 29 and cycle 199, a linear fit to the discharge capacity versus the cycle number curve can be obtained (e.g., liner curve 302 of FIG. 3). The slope (p1) and intercept (p2) of the liner curve 302 can be used as input features. The p1, p2 values calculated by liner curve fitting using data points of cycle 29 and cycle 199 are denoted as $(p1, p2)_{199\text{-}29}$ in FIG. 7. No DCIR tests are involved in these two input features;

(2) Q(V) features: the discharge capacity curves with standard charging and discharging rate (e.g., ranging from 0.3 C to 1 C) can be obtained. Characteristics can be extracted, such as the skew, kurtosis, variance, mean, minimum, and maximum of the difference between the Q(V) curves of different pairs of cycles, e.g., between cycle 10 and cycle 110. Such input features are denoted as $dQ(V)_{110\text{-}10}$ in FIG. 7. No DCIR tests are involved in these input features;

(3) DCIR features-internal resistance: As describe above in FIGS. 3-4B, during a DCIR test, the application of each current pulse induces a corresponding voltage drop from which an internal resistance measurement, R, can be obtained as R=V/I. These resistance measurements can be obtained for all 10 pulses at various SOC during the discharging portion of a battery cycle. The internal resistance values and/or differences between these internal resistances can be used as input features across different cycles. In some implementations, only internal resistance from cycle 2 are measured. These input features are denoted as DCIR pulses (cycle 2) in FIG. 7. As noted above, these input features can be used to predict battery cell performance, e.g., catastrophic fade;

(4) DCIR features-dQ(V): during a DCIR test, each current pulse and associated voltage drop can form a miniature Q(V) curve. For difference in the 10 miniature Q(V) curves across two cycles (e.g., cycle 2 and cycle 202), six summary statistics or characteristics, e.g., mean, minimum, maximum, variance, skew, and kurtosis, can be calculated, yielding 10×6=60 features, as described above in reference to FIGS. 3-4B. These input features are referenced as DCIR $dQ(V)_{202\text{-}2}$ in FIG. 7; and (5) dQ/dV features—the dQ/dV curve can encode cell chemistry information and reflect the completion of critical reactions at both anode and cathode. Therefore, the shift in dQ/dV curves across the cell's cycle life can provide valuable information in predicting battery cell performance. In the present example, the difference in dQ/dV curves across pairs of cycles (e.g., cycle 10 and cycle 90) are used to calculate characteristics, such as the skew, kurtosis, variance, min, max and mean. These input features are denoted as $dQ/dV_{90\text{-}10}$ in FIG. 7.

The five types of input features described above can be individually used as input features for each regression model. In addition, a combination of all these five types of input features, denoted as "All features" in FIG. 7, can also be used to evaluate the regression models. The voltage range for each cycle and each battery cell can be made the same when collecting battery test data for different input features.

The mean and deviation of RMSE with leave-one-out cross-validation (LOOCV) are calculated for evaluating the examples with different combination of regression models and input features. In some implementations, in LOOCV, the dataset is divided into subsets. The dataset is split such that each iteration uses one data point as the evaluation data 206B, while the rest of the data points form the training data 206A. The ML model 202 can be trained on the training data 206A and then tested on the evaluation data 206B in each iteration.

As illustrated in FIG. 7, in general, the Random Forest Regressor performs significantly better than Elastic Net for each type of input features. In particular, the combination of random forest regressor and all features provide the highest prediction accuracy with a mean RMSE around just 100 cycles. In addition, the performance of the same regression model with input features only derived from DCIR dQ(V)$_{202\text{-}2}$ also yields comparably good results, with a mean RMSE value around 104 cycles. DCIR pulse (cycle 2) also outperforms other non-DCIR input features, achieving a mean RMSE value of around 131. Therefore, in some situations, DCIR test data alone can yield favorable results, without a need to perform all the other tests described above. This reduction in testing not only lowers the associated battery costs but also simplifies the input battery test data, streamlining the overall process. It is to be understood that in addition to regression model and input features, the model performance can also depend on choice of different cycle pairs.

Figure 8:
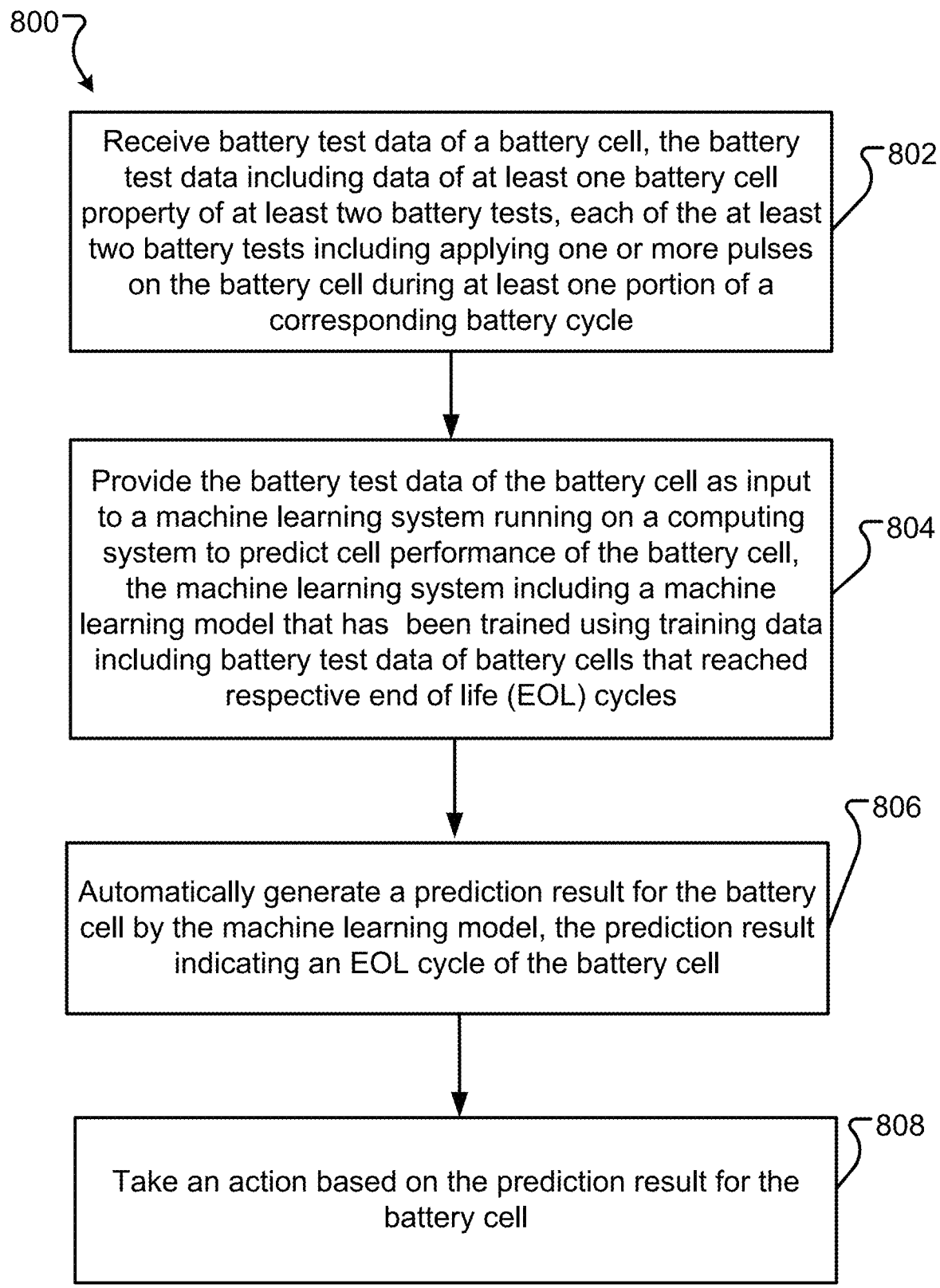
FIG. 8 is a flowchart of an example process of predicting battery performance with a machine learning system.

FIG. 8 is a flowchart of an example process 800 of predicting battery performance with a machine learning system. The process 800 can be performed by a computing system, e.g., the cloud computing system 130 of FIG. 1A or 1B. The machine learning system can be, e.g., the machine learning system 200 of FIG. 2.

At step 802, battery test data of a battery cell is received. The battery test data includes data of at least one battery cell property of at least two battery tests. Each of the at least two battery tests includes applying one or more pulses on the battery cell during at least one portion of a corresponding battery cycle. The battery test data can be, e.g., the battery test data 208 of FIG. 2. The pulses can be, e.g., current pulse 410 of FIG. 4A. The at least one portion of a corresponding battery cycle can be a charging portion or a discharging portion of a battery cycle.

In some implementations, the battery test data includes, for each of the one or more pulses, data based on a difference of the at least one battery cell property of the at least two battery tests, as describe above in reference to FIG. 4B.

In some implementations, the data based on the difference of the at least one battery cell property of the at least two battery tests includes: for each of the one or more pulses, one or more characteristics of data points associated with the pulse. In some implementations, the one or more characteristics include at least one of skew, kurtosis, variance, mean, minimum, or maximum.

In some implementations, the difference of the at least one battery cell property includes at least one of a battery cell capacity change, a ratio between a battery cell capacity change and a battery cell voltage, a ratio between a battery cell capacitance change and a battery cell voltage change, a battery cell internal resistance change, a ratio between a battery cell internal resistance change and a battery cell voltage, or a ratio between a battery cell internal resistance change and a battery cell voltage change, e.g., as describe above in reference to FIG. 4B and/or FIG. 7.

In some implementations, the corresponding battery cycle is a single cycle having a charging portion and a discharging portion. The at least one portion of the corresponding battery cycle includes one of the charging portion and the discharging portion. The one or more pulses include a plurality of current pulses. The battery test includes applying each of the plurality of current pulses on the battery cell when a capacity of the battery cell is changed from a respective charge by the predetermined percentage of state of charge (SOC). The discharging portion can be, e.g., the discharging portion 420 of FIG. 4A. The predetermined percentage of state of charge (SOC) can be, e.g., 10%.

In some implementations, each of the at least two battery tests includes at least one of Direct Current Internal Resistance (DCIR) test (e.g., as illustrated in FIGS. 4A-4B), Hybrid Pulse Power Characterization (HPPC) test, or minimum pulse power characterization (MPPC) test.

In some implementations, the at least one portion of the corresponding battery cycle includes the discharging portion having multiple periods associated with the predetermined percentage of SOC. Each of the plurality of current pulses is a current discharging pulse applied in a respective period of the multiple periods. The periods can be, e.g., the periods 412 of FIG. 4A.

In some implementations, the at least two battery tests include a first battery test during a first battery cycle and a second battery test during a second battery cycle that is later than the first battery cycle of a lifetime of the battery cell. In some implementations, the first battery cycle is within first 10 cycles of the lifetime of the battery cell. In some implementations, the first battery cycle is 2nd cycle of the lifetime of the battery cell. In some implementations, an interval between the first battery cycle and the second battery cycle is about 100 cycles. In some implementations, the first battery cycle and the second battery cycle are within about first 100 cycles of the lifetime of the battery cell.

In some implementations, receiving the battery test data of the battery cell includes: receiving the battery test data of the battery cell from a remote computing device in communication with the computing system through a communication network. The remote computing device can be, e.g., the remote computing device 120 of FIG. 1A. The computing system can be, e.g., the cloud computing platform 130 of FIGS. 1A and 1B. The communication network can be, e.g., the communication network 102 of FIG. 1A.

At step 804, the battery test data of the battery cell is provided as input to a machine learning system running on a computing system to predict cell performance of the battery cell. The machine learning system includes a machine learning model that has been trained using training data including battery test data of battery cells that reached respective end of life (EOL) cycles. The machine learning system can be, e.g., the machine learning system 200 of FIG. 2. The machine learning model can be, e.g., the machine learning model 202 of FIG. 2. The training data can be, e.g., the training data 206A of FIG. 2.

In some implementations, the machine learning model 202 includes a regression algorithm. The regression algorithm includes at least one of Random Forest Regression, Regularized Regression, or Nu Support Vector Regression.

In some implementations, each of the one or more characteristics of each of the one or more pulses is used as a respective input feature of one or more input features of the input to the machine learning model. A number of the one or more input features of the input to the machine learning model is identical to or greater than a product of a number of the one or more characteristics and a number of the one or more pulses, as describe above in reference to FIG. 4B.

In some implementations, after training the machine learning model with the training data, the machine learning model is evaluated with evaluation data that include battery test data of battery cells having a range of EOL cycles. The actions also include adjusting, based on a result of evaluating the machine learning model (e.g., RSME), one or more parameters of the machine learning model to further train the machine learning model 202'. The evaluation data can be, e.g., the evaluation data 206B of FIG. 2.

In some implementations, the machine learning model is a first machine learning model trained for a first type of battery cells. A second machine learning mode running on the computing system has been trained for a second type of battery cells. The first type of battery cells and the second type of battery cells have different battery cell chemistry. In some implementations, the machine learning model is trained for two or more types of battery cells that have different battery cell chemistry.

At step 806, a prediction result for the battery cell is automatically generated by the machine learning model. The prediction result indicates an EOL cycle of the battery cell. The prediction result can be, e.g., the prediction result 210 of FIG. 2.

In some implementations, the machine learning model is a first machine learning model. The training data includes battery test data of first battery cells that experienced catastrophic fade and battery test data of second battery cells that have a normal lifetime without experiencing catastrophic fade. The machine learning system includes a second machine learning model that has been trained using the training data. The battery test data of the battery cell is provided as input to the second machine learning model to predict whether the battery cell will experience catastrophic fade. In response, a second prediction result for the battery cell is automatically generated by the second machine learning model. The second prediction result indicates one of: i) the battery cell being a defective battery cell that will experience catastrophic fade, and ii) the battery cell being a normal battery cell that will not experience catastrophic fade. A second action is taken based on the second prediction result for the battery cell.

In some implementations, one or more parameters of the machine learning model are updated based on the battery test data of the battery cell and the prediction result for the battery cell.

At step 808, an action is taken based on the prediction result for the battery cell. In some implementations, taking the action based on the prediction result for the battery cell includes at least one of: transmitting the prediction result for the battery cell to the remote computing device through the communication network, or presenting the prediction result for the battery cell on a web portal of the computing system to be accessible by the remote computing device.

In some implementations, the battery test data of the battery cell includes data of a plurality of values of a battery cell property corresponding to a plurality of pulses in a portion of a single cycle of one of the at least two battery tests. The actions include providing the data of the plurality of values of the battery cell property of the battery cell as input to a second machine learning model running on the computing system to predict whether the battery cell will experience catastrophic fade. The second machine learning model has been trained using training data includes battery test data of battery cells that experienced catastrophic fade. In response, a second prediction result for the battery cell is automatically generated by the second machine learning model. The second prediction result indicates one of: i) the battery cell being a defective battery cell that will experience catastrophic fade, and ii) the battery cell being a normal battery cell that will not experience catastrophic fade. A second action is taken based on the second prediction result for the battery cell.

In some implementations, the single cycle is within first 10 cycles of the lifetime of the battery cell. In some implementations, the single cycle is the second cycle of the lifetime of the battery cell.

In some implementations, the second machine learning model includes at least one of Multilayer Perceptron Classifier (MLP), support vector machines (SVM) with nonlinear kernels, Decision Trees, Random Forests, artificial neural network, or gradient boosting machine (GBM).

Embodiments of the subject matter and the functional operations described in the present disclosure can be implemented in digital electronic circuitry, in tangibly-embodied computer software or firmware, in computer hardware, including the structures disclosed in the present disclosure and their structural equivalents, or in combinations of one or more of them. Embodiments of the subject matter described in the present disclosure can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in the present disclosure can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in the present disclosure can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in the present disclosure can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in the present disclosure, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some implementations, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While the present disclosure contains many specific implementation details, these should not be construed as limitations on the scope of any invention or on the scope of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A computer-implemented method for predicting battery cell performance, the computer-implemented method comprising:
   performing at least two battery tests to generate battery test data of a battery cell, the battery test data comprising data of at least one battery cell property of the at least two battery tests, each of the at least two battery tests comprising applying a plurality of pulses on the battery cell during a corresponding battery cycle and measuring a charge-voltage curve for the corresponding battery cycle, the charge-voltage curve comprising a respective charge-voltage curve portion for each of the plurality of pulses;
   providing the battery test data of the battery cell as input to a machine learning system running on a computing system to predict cell performance of the battery cell, wherein the machine learning system comprises a machine learning model that has been trained using training data including battery test data of battery cells that reached respective end of life (EOL) cycles, and, in response, automatically generating a prediction result for the battery cell by the machine learning model, the prediction result indicating an EOL cycle of the battery cell; and taking an action based on the prediction result for the battery cell, wherein the battery test data of the battery cell comprises features describing a difference of the at least one battery cell property for at least two battery cycles of the at least two battery tests, and wherein the features comprise, for each of the plurality of pulses, one or more characteristics of the at least one battery cell property based on corresponding data points between the respective charge-voltage curve portions for the at least two battery cycles.

2. The computer-implemented method of claim 1, wherein each of the at least two battery tests comprises at least one of Direct Current Internal Resistance (DCIR) test, Hybrid Pulse Power Characterization (HPPC) test, or minimum pulse power characterization (MPPC) test.

3. The computer-implemented method of claim 1, wherein the corresponding battery cycle is a single cycle having a charging portion and a discharging portion, and wherein each of the at least two battery tests is performed in the discharging portion of the corresponding battery cycle, and wherein the plurality of pulses comprise a plurality of current pulses, and wherein each of the at least two battery tests comprises applying each of the plurality of current pulses on the battery cell when a capacity of the battery cell is changed from a respective charge by a predetermined percentage of state of charge (SOC).

4. The computer-implemented method of claim 3, wherein the discharging portion of the corresponding battery cycle comprises multiple periods associated with the predetermined percentage of SOC, and each of the plurality of current pulses is a current discharging pulse applied in a respective period of the multiple periods.

5. The computer-implemented method of claim 1, wherein the at least two battery tests comprise a first battery test during a first battery cycle and a second battery test during a second battery cycle that is later than the first battery cycle of a lifetime of the battery cell.

6. The computer-implemented method of claim 5, wherein the first battery cycle is within first 10 cycles of the lifetime of the battery cell.

7. The computer-implemented method of claim 5, wherein the first battery cycle and the second battery cycle are within about first 100 cycles of the lifetime of the battery cell.

8. The computer-implemented method of claim 1, wherein the machine learning model comprises a regression algorithm, and wherein the regression algorithm comprises at least one of Random Forest Regression, Regularized Regression, or Nu Support Vector Regression.

9. The computer-implemented method of claim 1, further comprising:

after training the machine learning model with the training data, evaluating the machine learning model with evaluation data that comprise battery test data of battery cells having a range of EOL cycles; and adjusting, based on a result of evaluating the machine learning model, one or more parameters of the machine learning model to further train the machine learning model.

10. The computer-implemented method of claim 1, further comprising:

updating one or more parameters of the machine learning model based on the battery test data of the battery cell and the prediction result for the battery cell.

11. The computer-implemented method of claim 1, wherein the machine learning model is a first machine learning model, and the training data comprises battery test data of first battery cells that experienced catastrophic fade and battery test data of second battery cells that have a normal lifetime without experiencing catastrophic fade, wherein the machine learning system comprises a second machine learning model that has been trained using the training data, and wherein the computer-implemented method further comprises:

providing the battery test data of the battery cell as input to the second machine learning model to predict whether the battery cell will experience catastrophic fade, and, in response, automatically generating a second prediction result for the battery cell by the second machine learning model, wherein the second prediction result indicates one of: i) the battery cell being a defective battery cell that will experience catastrophic fade, and ii) the battery cell being a normal battery cell that will not experience catastrophic fade, and taking a second action based on the second prediction result for the battery cell.

12. The computer-implemented method of claim 11, wherein the second machine learning model comprises at least one of Multilayer Perceptron Classifier (MLP), support vector machines (SVM) with nonlinear kernels, Decision Trees, Random Forests, artificial neural network, or gradient boosting machine (GBM).

13. The computer-implemented method of claim 1, further comprising receiving the battery test data of the battery cell from a remote computing device in communication with the computing system through a communication network, and wherein taking the action based on the prediction result for the battery cell comprises at least one of:

transmitting the prediction result for the battery cell to the remote computing device through the communication network, or presenting the prediction result for the battery cell on a web portal of the computing system to be accessible by the remote computing device.

14. The computer-implemented method of claim 1, wherein taking the action based on the prediction result for the battery cell comprises:

presenting at least one of i) the prediction result for the battery cell or ii) an indication of a quality control (QC) for the battery cell on a web portal of the computing system to be accessible by a remote computing device, wherein the indication of the QC for the battery cell comprises an indication for at least one of:

replacing battery cells before failure, isolating problematic battery cells from a rest of a same batch or a same production line, adjusting a manufacturing process, updating a quality control procedure, improving a design specification, or adopting a new material or a new process flow.

15. A method of predicting battery cell performance, the method comprising:

performing at least two battery tests to generate, for each cycle of at least a first cycle and a second cycle of a battery cell, data of a charge-voltage curve for the cycle in a corresponding battery test, each of the at least two battery tests comprising: applying a plurality of pulses to the battery cell during cycling the battery cell between a first voltage and a second voltage in the cycle, and measuring a respective charge-voltage curve portion for each of the plurality of pulses, the charge-voltage curve for the cycle comprising the respective charge-voltage curve portion for each of the plurality of pulses;

calculating, using the data from the charge-voltage curves for the first cycle and the second cycle, features describing a difference of at least one battery cell property between the charge-voltage curves for the first cycle and for the second cycle;

providing the features of the battery cell as input to a machine learning system to predict cell performance of the battery cell, wherein the machine learning system comprises a machine learning model that has been trained using training data including battery test data of battery cells that reached respective end of life (EOL) cycles, and, in response, automatically generating a prediction result for the battery cell by the machine learning model, the prediction result indicating an EOL cycle of the battery cell; and taking an action based on the prediction result for the battery cell, wherein calculating the features describing the difference between the charge-voltage curves for the first cycle and for the second cycle comprise:

for each of the plurality of pulses, determining differences of the at least one battery cell property based on corresponding data points between the respective charge-voltage curve portions for the first cycle and the second cycle, and calculating one or more characteristics of the differences of the at least one battery cell property for the pulse, wherein the features comprise each of the calculated one or more characteristics for the pulse of the plurality of pulses.

16. The method of claim 15, wherein the one or more characteristics comprise at least one of skew, kurtosis, variance, mean, minimum, or maximum.

17. The method of claim 15, wherein the input to the machine learning model comprises a plurality of input features, and a number of the plurality of input features of the input is identical to or greater than a product of a number of the one or more characteristics and a number of the plurality of pulses.

18. The method of claim 15, wherein the difference of the at least one battery cell property comprises at least one of:

a battery cell capacity change, a ratio between a battery cell capacity change and a battery cell voltage, a ratio between a battery cell capacitance change and a battery cell voltage change, a battery cell internal resistance change, a ratio between a battery cell internal resistance change and a battery cell voltage, or a ratio between a battery cell internal resistance change and a battery cell voltage change.

19. The method of claim 15, wherein taking the action comprises providing an indication to cause a user to perform at least one of:

replacing battery cells before failure, isolating problematic battery cells from a rest of a same batch or a same production line, adjusting a manufacturing process, updating a quality control procedure, improving a design specification, or adopting a new material or a new process flow.

20. A system comprising:

one or more computers; and one or more storage devices on which are stored instructions that are operable, when executed by the one or more computers, to cause the one or more computers to perform operations for predicting battery cell performance, the operations comprising:

performing at least two battery tests to generate battery test data of a battery cell, the battery test data comprising data of at least one battery cell property of the at least two battery tests, each of the at least two battery tests comprising applying a plurality of pulses on the battery cell during a corresponding battery cycle and measuring a charge-voltage curve for the corresponding battery cycle, the charge-voltage curve comprising a respective charge-voltage curve portion for each of the plurality of pulses;

providing the battery test data of the battery cell as input to a machine learning system to predict cell performance of the battery cell, wherein the machine learning system comprises a machine learning model that has been trained using training data including battery test data of battery cells that reached respective end of life (EOL) cycles, and, in response, automatically generating a prediction result for the battery cell by the machine learning model, the prediction result indicating an EOL cycle of the battery cell; and taking an action based on the prediction result for the battery cell, wherein the battery test data of the battery cell comprises features describing a difference of the at least one battery cell property for at least two battery cycles of the at least two battery tests, and wherein the features comprise, for each of the plurality of pulses, one or more characteristics of the at least one battery cell property based on corresponding data points between the respective charge-voltage curve portions for the at least two battery cycles.

* * * * *